(12) United States Patent
Otsuji

(10) Patent No.: US 11,154,913 B2
(45) Date of Patent: Oct. 26, 2021

(54) SUBSTRATE TREATMENT METHOD AND SUBSTRATE TREATMENT DEVICE

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

(*) Notice: Subject to any disclaimer, the term of this patent is extended or adjusted under 35 U.S.C. 154(b) by 389 days.

(21) Appl. No.: 15/744,127

(22) PCT Filed: Jun. 7, 2016

(86) PCT No.: PCT/JP2016/066954
§ 371 (c)(1),
(2) Date: Jan. 12, 2018

(87) PCT Pub. No.: WO2017/029861
PCT Pub. Date: Feb. 23, 2017

(65) Prior Publication Data
US 2018/0200763 A1    Jul. 19, 2018

(30) Foreign Application Priority Data
Aug. 18, 2015 (JP) .............................. JP2015-161325

(51) Int. Cl.
*B08B 3/10* (2006.01)
*H01L 21/67* (2006.01)
(Continued)

(52) U.S. Cl.
CPC .......... *B08B 3/10* (2013.01); *H01L 21/02052* (2013.01); *H01L 21/6715* (2013.01);
(Continued)

(58) Field of Classification Search
CPC ....... B08B 3/10; B08B 7/00; H01L 21/02052; H01L 21/67028; H01L 21/67034;
(Continued)

(56) References Cited

U.S. PATENT DOCUMENTS 5,601,655 A * 2/1997 Bok ........................ B08B 3/123
134/1
5,807,439 A * 9/1998 Akatsu .............. H01L 21/67023
134/32

(Continued)

FOREIGN PATENT DOCUMENTS

CN        103681236 A      3/2014
JP        2004-119717 A    4/2004
(Continued)

OTHER PUBLICATIONS

International Preliminary Report on Patentability (Chapter I) dated Mar. 1, 2018 with a Notification from the International Bureau (Form PCT/IB/326) in corresponding PCT International Application No. PCT/JP2016/066954 in Japanese.
(Continued)

*Primary Examiner* — Alexander Markoff
(74) *Attorney, Agent, or Firm* — Ostrolenk Faber LLP

(57) ABSTRACT

A substrate processing method includes a vapor atmosphere filling step of filling surroundings of a liquid film of a processing liquid with a vapor atmosphere containing a vapor of a low surface tension liquid that has a lower surface tension than the processing liquid, a dry region forming step of forming a dry region in the liquid film of the processing liquid by partially excluding the processing liquid while spraying a gas containing the vapor of the low surface tension liquid onto the liquid film of the processing liquid in parallel with the vapor atmosphere filling step, and a dry region expanding step of expanding the dry region toward an outer periphery of a substrate while rotating the substrate in parallel with the vapor atmosphere filling step.

5 Claims, 18 Drawing Sheets

(51) Int. Cl.
  *H01L 21/02* (2006.01)
  *H01L 21/687* (2006.01)
  *B08B 7/00* (2006.01)
(52) U.S. Cl.
  CPC .. *H01L 21/67028* (2013.01); *H01L 21/67034* (2013.01); *H01L 21/68728* (2013.01); *B08B 7/00* (2013.01)
(58) Field of Classification Search
  CPC ........... H01L 21/6715; H01L 21/68728; H01L 21/304; H01L 21/67051
  See application file for complete search history.

(56) References Cited

U.S. PATENT DOCUMENTS

| | | | | |
|---|---|---|---|---|
| 5,884,640 A * | 3/1999 | Fishkin | H01L 21/67034 | 134/186 |
| 6,139,645 A * | 10/2000 | Leenaars | H01L 21/67023 | 134/30 |
| 6,328,809 B1 * | 12/2001 | Elsawy | H01L 21/67028 | 134/3 |
| 6,357,138 B2 * | 3/2002 | Nakabeppu | H01L 21/67028 | 34/329 |
| 6,746,544 B2 * | 6/2004 | Fishkin | H01L 21/67028 | 134/26 |
| 6,770,151 B1 * | 8/2004 | Ravkin | H01L 21/02052 | 134/33 |
| 7,614,411 B2 * | 11/2009 | Korolik | H01L 21/67028 | 134/102.1 |
| 10,730,059 B2 * | 8/2020 | Kobayashi | H01L 21/67028 | |
| 2004/0045589 A1 * | 3/2004 | Holsteyns | H01L 21/6708 | 134/32 |
| 2007/0295365 A1 * | 12/2007 | Miya | H01L 21/02057 | 134/26 |
| 2008/0017222 A1 * | 1/2008 | Miya | H01L 21/67051 | 134/21 |
| 2008/0052947 A1 * | 3/2008 | Miya | H01L 21/67028 | 34/317 |
| 2008/0092929 A1 * | 4/2008 | Yokouchi | H01L 21/67051 | 134/30 |
| 2008/0190454 A1 * | 8/2008 | Eitoku | H01L 21/02057 | 134/19 |
| 2009/0032067 A1 | 2/2009 | Kojimaru et al. | | 134/26 |
| 2009/0101181 A1 | 4/2009 | Morisawa et al. | | 134/94.1 |
| 2009/0205684 A1 | 8/2009 | Orii et al. | | 134/33 |
| 2011/0155181 A1 | 6/2011 | Inatomi | | 134/30 |
| 2012/0090647 A1 * | 4/2012 | Miya | H01L 21/67051 | 134/30 |
| 2013/0171831 A1 * | 7/2013 | Namba | H01L 21/30604 | 438/748 |
| 2014/0060575 A1 | 3/2014 | Lee et al. | | 134/4 |
| 2014/0174483 A1 * | 6/2014 | Miya | H01L 21/67051 | 134/30 |
| 2015/0179431 A1 | 6/2015 | Kimura et al. | | |
| 2015/0270146 A1 * | 9/2015 | Yoshihara | H01L 21/67253 | 134/18 |
| 2016/0256901 A1 * | 9/2016 | Kobayashi | B05B 1/14 | |

FOREIGN PATENT DOCUMENTS

| | | |
|---|---|---|
| JP | 2008-034428 A | 2/2008 |
| JP | 2009-238793 A | 10/2009 |
| JP | 2011-135002 A | 7/2011 |
| JP | 2013-131783 A | 7/2013 |
| KR | 20-2000-0013902 U | 7/2000 |
| KR | 10-0797080 B1 | 1/2008 |
| KR | 10-2009-0088800 A | 8/2009 |

OTHER PUBLICATIONS

International Preliminary Report on Patentability (Chapter I) dated Mar. 1, 2018 with a Notification from the International Bureau (Form PCT/IB/338) in corresponding PCT International Application No. PCT/JP2016/066954 in English.
International Search Report dated Aug. 16, 2016 in corresponding PCT International Application No. PCT/JP2016/066954.
Written Opinion dated Aug. 16, 2016 in corresponding PCT International Application No. PCT/JP2016/066954.

* cited by examiner

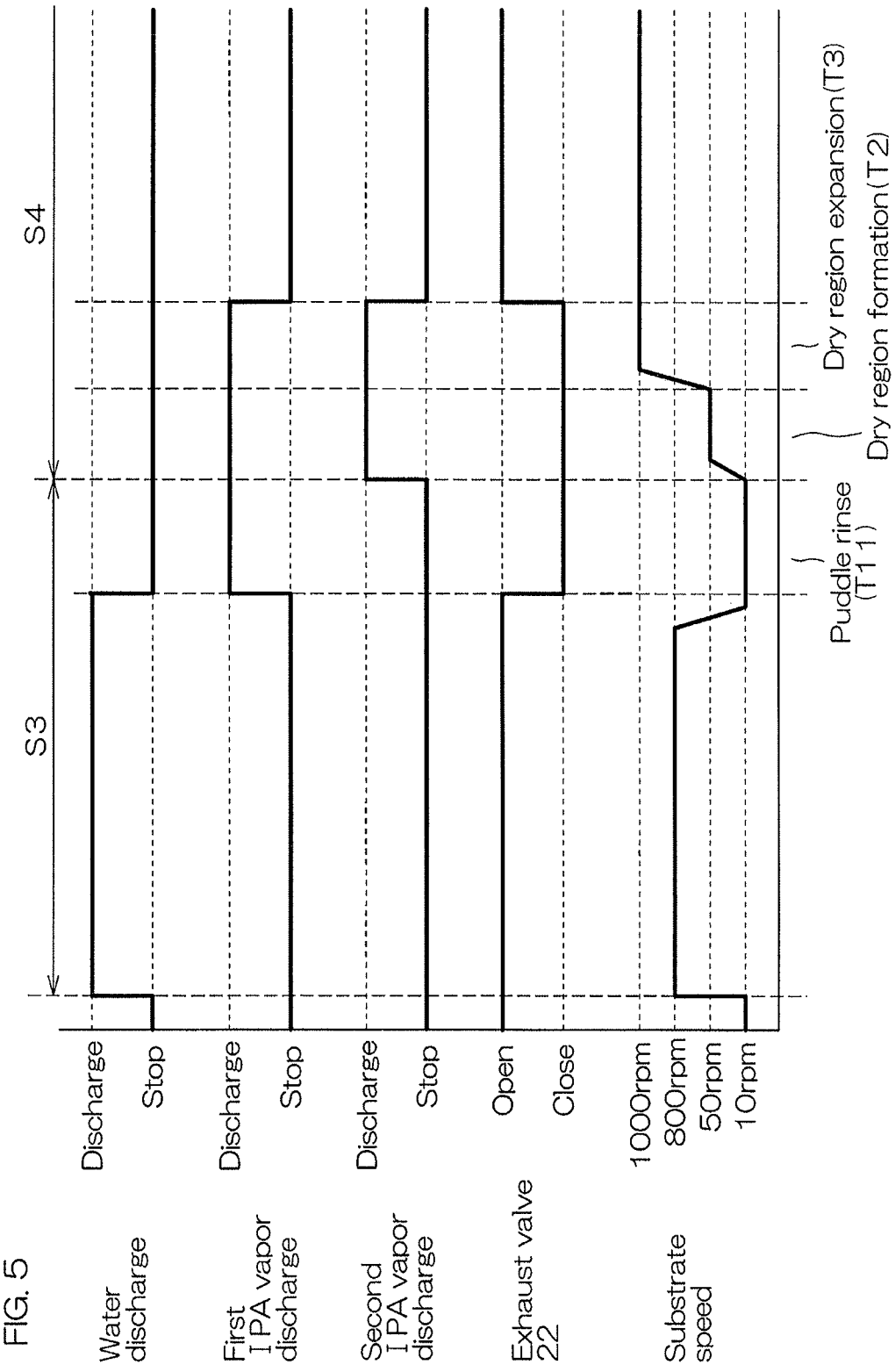

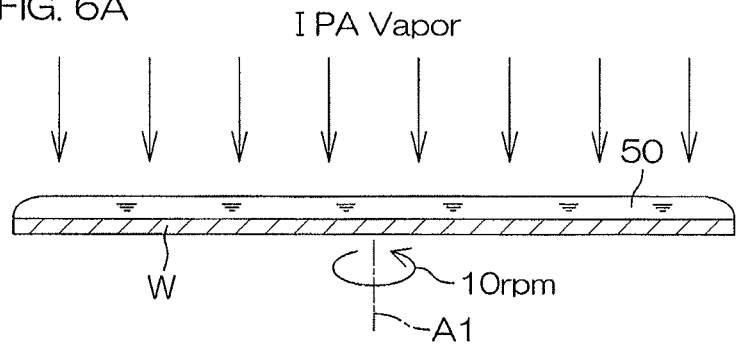
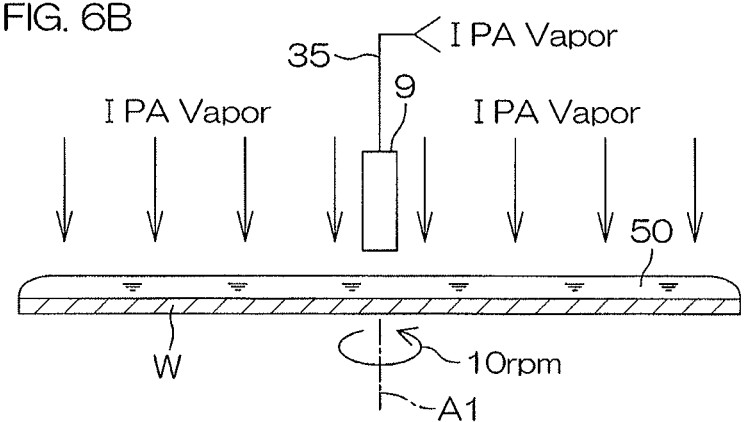

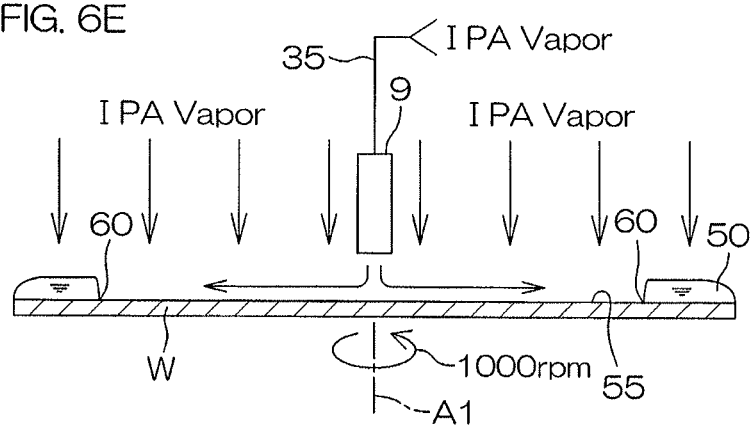
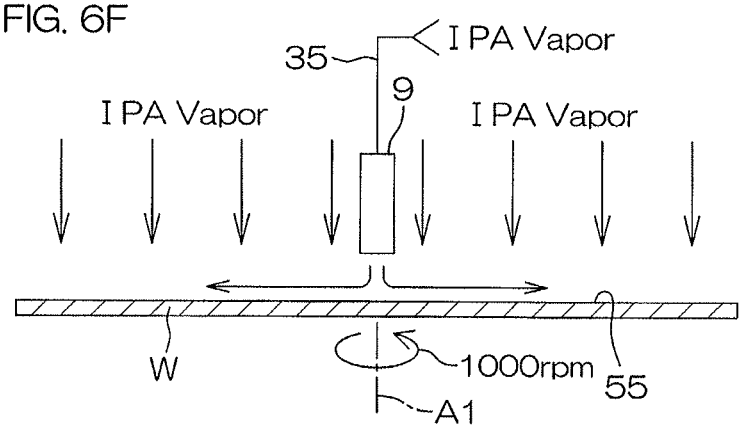

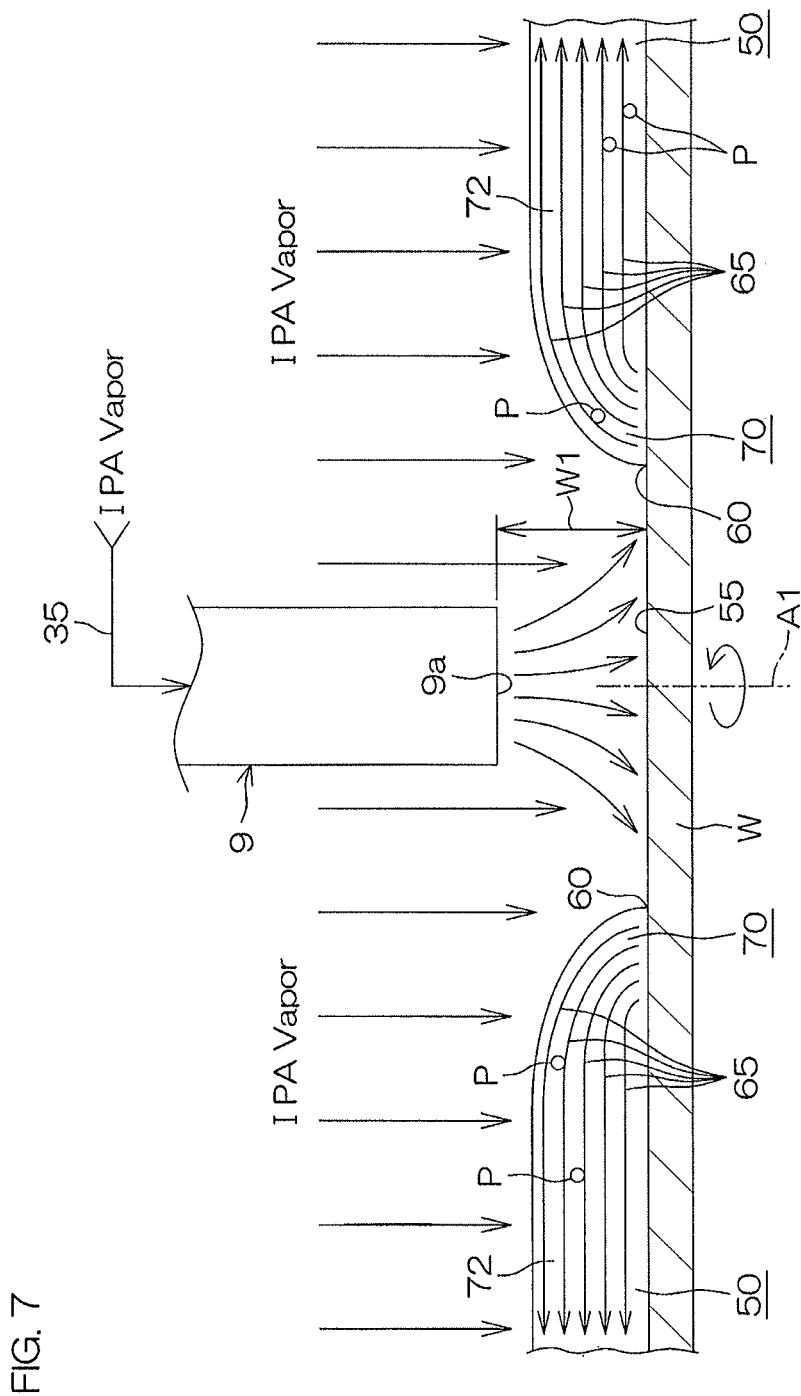

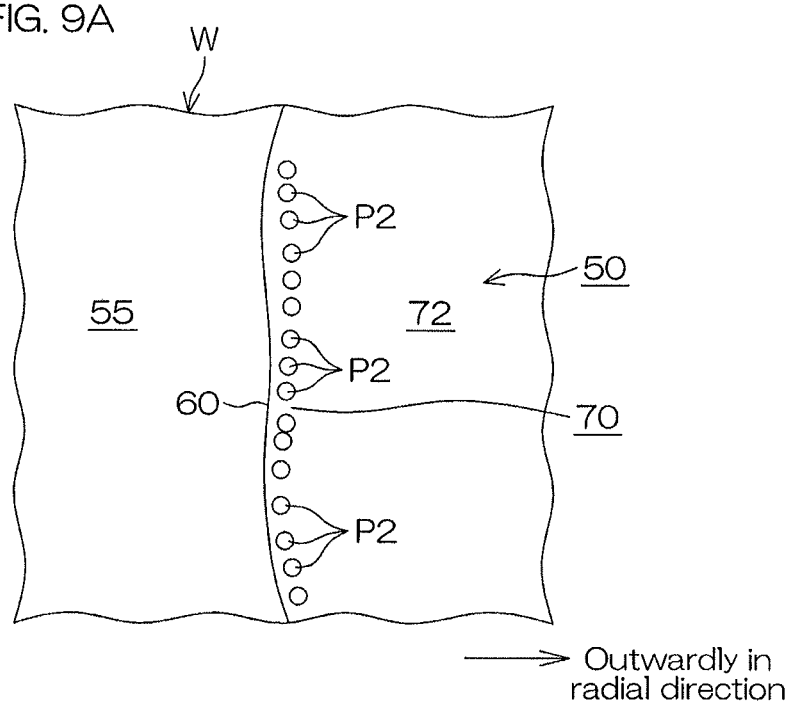
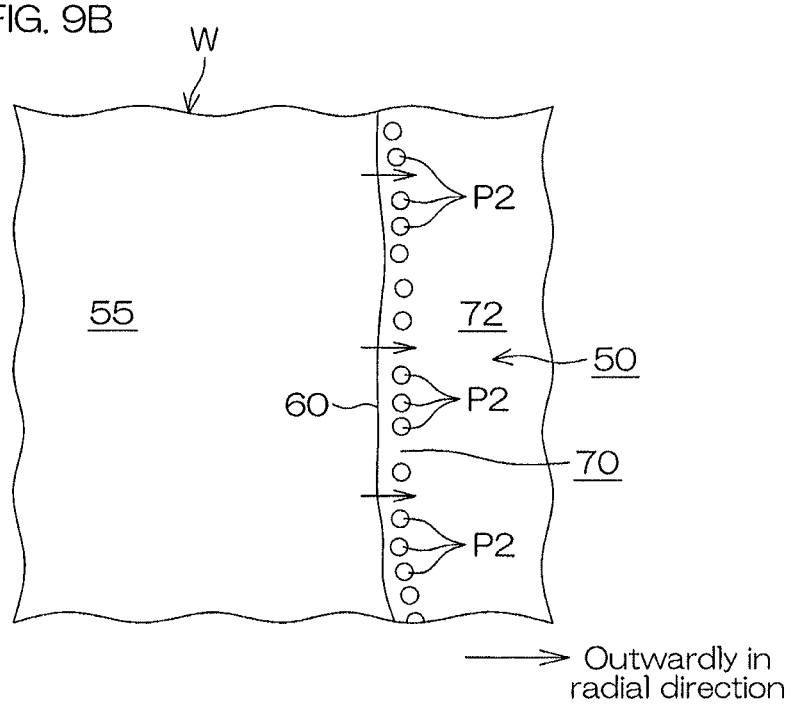

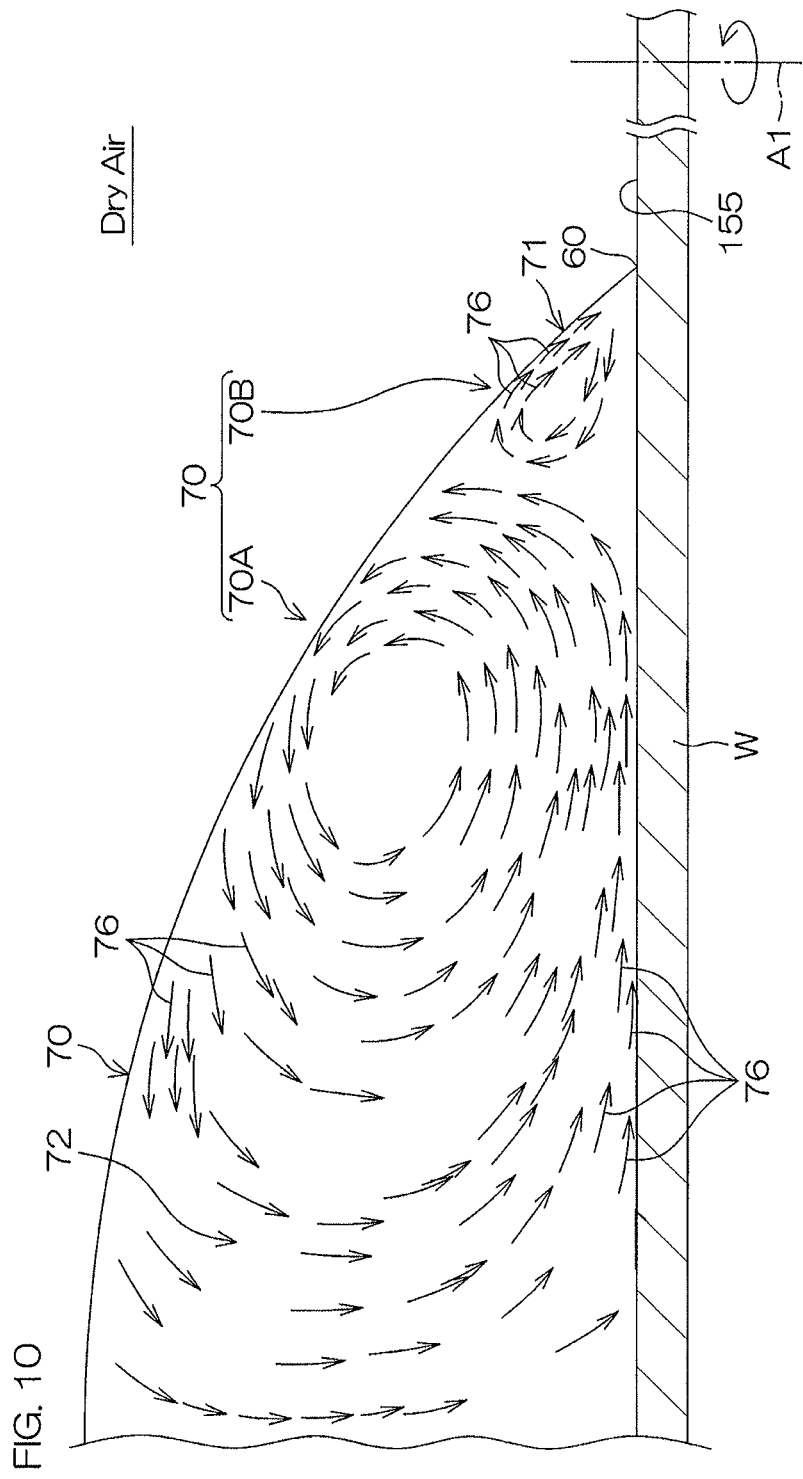

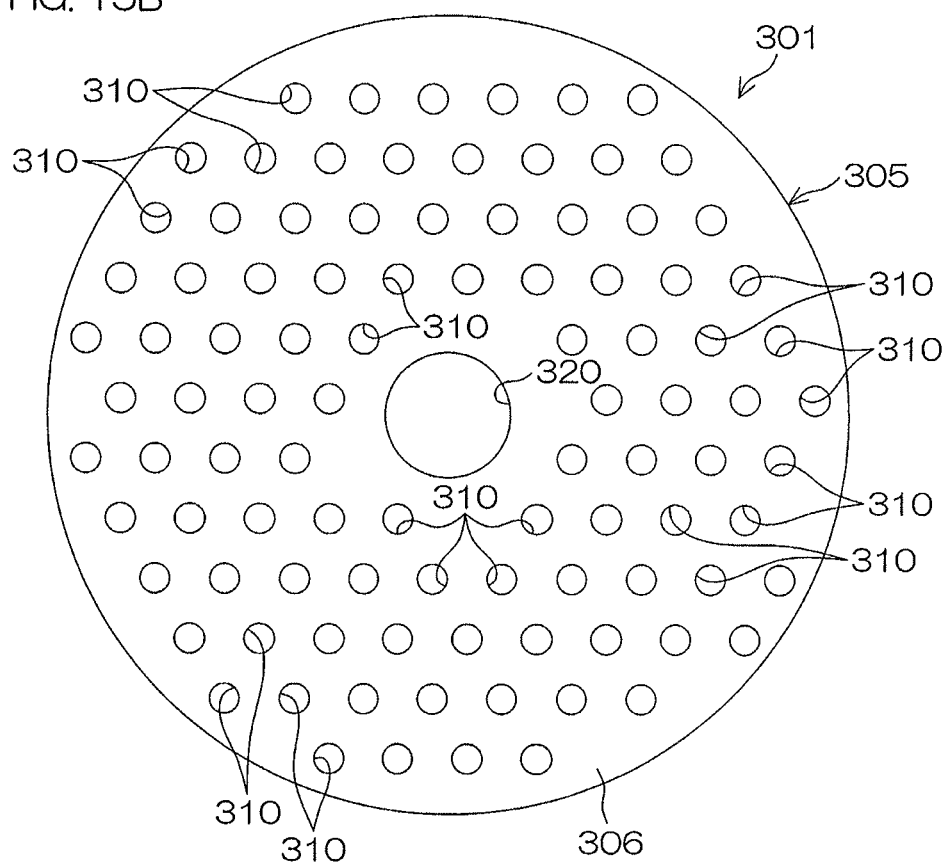

SUBSTRATE TREATMENT METHOD AND SUBSTRATE TREATMENT DEVICE

CROSS-REFERENCE TO RELATED APPLICATIONS

The present application is a 35 U.S.C. §§ 371 national phase conversion of PCT/JP2016/066954, filed Jun. 7, 2016, which claims priority to Japanese Patent Application No. 2015-161325, filed Aug. 18, 2015, the contents of both of which are incorporated herein by reference. The PCT International Application was published in the Japanese language.

TECHNICAL FIELD

The present invention relates to a substrate processing method and a substrate processing apparatus for processing an upper surface of a substrate by use of a processing liquid. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

In a manufacturing process of a semiconductor device, a front surface of a substrate, such as a semiconductor wafer, is supplied with a processing liquid, and is processed by use of the processing liquid.

For example, a single substrate processing type apparatus that processes substrates one by one includes a spin chuck that rotates a substrate while holding the substrate substantially horizontally and a nozzle that supplies a processing liquid to an upper surface of the substrate being rotated by the spin chuck. For example, a chemical liquid is supplied to a substrate held by the spin chuck, and then a rinse liquid is supplied thereto, and, as a result, the chemical liquid on the substrate is replaced with the rinse liquid. Thereafter, drying is executed to exclude the rinse liquid from the upper surface of the substrate.

As the dry processing, a technique is known in which the vapor of isopropyl alcohol (IPA) whose boiling point is lower than water is supplied to the front surface of the substrate being in a rotational state in order to restrain the occurrence of watermarks. For example, Rotagoni drying (see Patent Literature 1) is an example of the technique.

PRIOR ART DOCUMENTS

Citation List

Patent Literature 1: Japanese Patent Application Publication No. 2013-131783

SUMMARY OF INVENTION

Technical Problem

More specifically, in this drying method, a liquid film of a processing liquid (rinse liquid) is formed on the upper surface of the substrate, and a vapor of a low surface tension liquid (IPA) is sprayed onto the liquid film of the processing liquid, thereby forming a liquid film removal region. Thereafter, the liquid film removal region is expanded, and is expanded over the whole area of the upper surface of the substrate, and, as a result, the upper surface of the substrate is dried.

However, in this drying method, there is a fear that particles included in the processing liquid will appear on the upper surface of the substrate, and, as a result, particles will occur on a front surface (to-be-processed surface) of the substrate that has been dried.

Therefore, an object of the present invention is to provide a substrate processing method and a substrate processing apparatus that are capable of drying an upper surface of a substrate while reducing or preventing the occurrence of particles.

Solution to Problem

The present invention provides a substrate processing method that includes a substrate holding step of horizontally holding a substrate, a liquid film forming step of supplying a processing liquid to an upper surface of the substrate and forming a liquid film of the processing liquid with which the upper surface of the substrate is covered, a vapor atmosphere filling step of filling surroundings of the liquid film of the processing liquid with a vapor atmosphere containing a vapor of a low surface tension liquid that has a lower surface tension than the processing liquid, a dry region forming step of forming a dry region in the liquid film of the processing liquid by partially excluding the processing liquid while spraying a gas containing the vapor of the low surface tension liquid onto the liquid film of the processing liquid in parallel with the vapor atmosphere filling step, and a dry region expanding step of expanding the dry region toward an outer periphery of the substrate while rotating the substrate in parallel with the vapor atmosphere filling step.

According to this method, the surroundings of the whole area of the liquid film of a processing liquid with which the upper surface of the substrate is covered is filled with a vapor atmosphere containing the vapor of a low surface tension liquid (which is hereinafter referred to simply as a "vapor atmosphere." The same applies in this section.) Also, in this state, a gas containing the vapor of the low surface tension liquid is sprayed onto the liquid film of the processing liquid. As a result, the processing liquid is partially excluded, and hence a dry region is formed in the liquid film of the processing liquid.

Thereafter, the dry region forming step and the dry region expanding step are successively executed while keeping the surroundings of the whole area of the liquid film of the processing liquid with which the upper surface of the substrate is covered in a vapor atmosphere. Therefore, it is possible to keep the surroundings of a part near a gas-liquid-solid interface (hereinafter, referred to as a "near-interface part") of the liquid film of the processing liquid in a vapor atmosphere to the end of the expansion of the dry region irrespective of an expansion situation of the dry region. When the substrate is rotated in a state in which the surroundings of the near-interface part of the liquid film of the processing liquid are kept in a vapor atmosphere, Marangoni convection flowing in a direction away from the gas-liquid-solid interface occurs inside the near-interface part because of a difference in the concentration of the low surface tension liquid based on a local difference in thickness of the liquid film of the processing liquid. Therefore, it is possible to continue to generate Marangoni convection inside the liquid film of the processing liquid over the entire period of the dry region forming step and the dry region expanding step.

Consequently, particles included in the near-interface part of the liquid film of the processing liquid receive the Marangoni convection, and are moved in the direction away from the gas-liquid-solid interface. Therefore, the particles are taken into the liquid film of the processing liquid. With the expansion of the dry region, the gas-liquid-solid interface is moved outwardly in the radial direction of the substrate, and the dry region is expanded while the particles are still being taken in the liquid film of the processing liquid. Thereafter, the particles included in the liquid film of the processing liquid are discharged from the upper surface of the substrate together with the liquid film of the processing liquid without appearing in the dry region. Consequently, after the substrate is dried, the particles never remain on the upper surface of the substrate. Therefore, it is possible to dry the whole area of the upper surface of the substrate while reducing or preventing the particles from being generated.

In a preferred embodiment of the present invention, the method further include a blocking step of bringing an upper space above the substrate into a blocked state of being blocked from outside, and the vapor atmosphere filling step is executed by supplying the gas to the space after the blocking step.

According to this method, a space including the upper space above the substrate is brought into a blocked state, and therefore this space is hardly influenced by a disturbance of an external atmosphere. It is possible to fill the surroundings of the liquid film of the processing liquid with a vapor atmosphere by supplying a gas to the space.

The method may further include an open high speed rotation step of rotating the substrate at a predetermined high rotational speed while opening the space to the outside after the dry region expanding step.

According to this method, a fresh gas comes into contact with the upper surface of the substrate by making the space open to the outside. Therefore, the diffusion of the vapor of the processing liquid progresses at different places of the upper surface of the substrate, and, as a result, the evaporation of the processing liquid progresses at these different places. Also, it is possible to shake off the processing liquid on the upper surface of the substrate by the high speed rotation of the substrate. This makes it possible to excellently dry the upper surface of the substrate.

Also, the method may further include a puddle step of bringing the substrate into a stationary state or rotating the substrate at a puddle speed around the rotational axis in parallel with the liquid film forming step.

According to this method, it is possible to keep the thickness of the near-interface part of the liquid film of the processing liquid formed on the upper surface of the substrate large because the puddle step is executed in parallel with the liquid film forming step. If the thickness of the near-interface part of the liquid film of the processing liquid is large, it is possible to keep the concentration gradient of the low surface tension liquid in the liquid film of the processing liquid large in the dry region expanding step, hence making it possible to strengthen Marangoni convection generated in the liquid film of the processing liquid.

In the method, the dry region expanding step may include a high speed rotation step of rotating the substrate at a higher speed than in the liquid film forming step.

According to this method, the substrate is rotated at a high speed in the dry region expanding step, and therefore a strong centrifugal force acts on the substrate, and it is possible to make a difference in film thickness of the near-interface part of the liquid film of the processing liquid more distinct by means of the centrifugal force. This makes it possible to keep the concentration gradient of the low surface tension liquid that occurs in the near-interface part of the liquid film of the processing liquid large, hence making it possible to even further strengthen Marangoni convection generated in the near-interface part of the liquid film of the processing liquid.

The processing liquid may include water, and the low surface tension liquid may include an organic solvent.

According to this method, the dry region forming step and the dry region expanding step are successively executed while keeping the surroundings of the whole area of the liquid film of water with which the upper surface of the substrate is covered in an organic-solvent-vapor atmosphere. Therefore, it is possible to keep the surroundings of the near-interface part of the liquid film of water in an organic-solvent-vapor atmosphere to the end of the expansion of the dry region irrespective of an expansion situation of the dry region. When the substrate is rotated in a state in which the surroundings of the near-interface part of the liquid film of water are kept in an organic-solvent-vapor atmosphere, Marangoni convection flowing in a direction away from the gas-liquid-solid interface occurs inside the near-interface part because of a difference in the concentration of the organic solvent based on a local difference in thickness of the liquid film of water. Therefore, it is possible to continue to generate Marangoni convection inside the liquid film of water over the entire period of the dry region forming step and the dry region expanding step. Consequently, particles included in the near-interface part of the liquid film of water receive the Marangoni convection, and are moved in the direction away from the gas-liquid-solid interface. Therefore, the particles are taken into the liquid film of water. With the expansion of the dry region, the gas-liquid-solid interface is moved outwardly in the radial direction of the substrate, and the dry region is expanded while the particles are still being taken in the liquid film of water. Thereafter, the particles included in the liquid film of water are discharged from the upper surface of the substrate together with the liquid film of water without appearing in the dry region. Consequently, after the substrate is dried, the particles never remain on the upper surface of the substrate. Therefore, it is possible to dry the whole area of the upper surface of the substrate while reducing or preventing the particles from being generated.

Also, the present invention provides a substrate processing apparatus that includes a substrate holding unit that horizontally holds a substrate, a processing liquid supply unit for supplying a processing liquid to an upper surface of the substrate, a first gas supply unit for supplying a gas containing a vapor of a low surface tension liquid that has a lower surface tension than the processing liquid to surroundings of the upper surface of the substrate, a gas discharge nozzle for discharging a gas toward the upper surface of the substrate, a second gas supply unit for supplying the gas containing the vapor of the low surface tension liquid to the gas discharge nozzle, and a controller that controls the processing liquid supply unit, the first gas supply unit, and the second gas supply unit, in which the controller executes a liquid film forming step of supplying a processing liquid to the upper surface of the substrate and forming a liquid film of the processing liquid with which the upper surface of the substrate is covered, a vapor atmosphere filling step of filling surroundings of the liquid film of the processing liquid with a vapor atmosphere containing the vapor of the low surface tension liquid, a dry region forming step of forming a dry region in the liquid film of the processing liquid by partially excluding the processing liquid while spraying a gas containing the vapor of the low surface tension liquid in a state in which the surroundings of the liquid film of the processing liquid are kept in the vapor atmosphere, and a dry region expanding step of expanding the dry region toward an outer periphery of the substrate in a state in which the surroundings of the liquid film of the processing liquid are kept in the vapor atmosphere.

According to this arrangement, the surroundings of the whole area of the liquid film of a processing liquid with which the upper surface of the substrate is covered are filled with a vapor atmosphere containing the vapor of a low surface tension liquid (which is hereinafter referred to simply as a "vapor atmosphere." The same applies in this section.) Also, in this state, a gas containing the vapor of the low surface tension liquid is sprayed onto the liquid film of the processing liquid. As a result, the processing liquid is partially excluded, and hence a dry region is formed in the liquid film of the processing liquid.

Thereafter, the dry region forming step and the dry region expanding step are successively executed while keeping the surroundings of the whole area of the liquid film of the processing liquid with which the upper surface of the substrate is covered in a vapor atmosphere. Therefore, it is possible to keep the surroundings of a part near a gas-liquid-solid interface (hereinafter, referred to as a "near-interface part") of the liquid film of the processing liquid in a vapor atmosphere to the end of the expansion of the dry region irrespective of an expansion situation of the dry region. When the substrate is rotated in a state in which the surroundings of the near-interface part of the liquid film of the processing liquid are kept in a vapor atmosphere, Marangoni convection flowing in a direction away from the gas-liquid-solid interface occurs inside the near-interface part because of a difference in the concentration of the low surface tension liquid based on a local difference in thickness of the liquid film of the processing liquid. Therefore, it is possible to continue to generate Marangoni convection inside the liquid film of the processing liquid over the entire period of the dry region forming step and the dry region expanding step.

Consequently, particles included in the near-interface part of the liquid film of the processing liquid receive the Marangoni convection, and are moved in the direction away from the gas-liquid-solid interface. Therefore, the particles are taken into the liquid film of the processing liquid. With the expansion of the dry region, the gas-liquid-solid interface is moved outwardly in the radial direction of the substrate, and the dry region is expanded while the particles are still being taken in the liquid film of the processing liquid. Thereafter, the particles included in the liquid film of the processing liquid are discharged from the upper surface of the substrate together with the liquid film of the processing liquid without appearing in the dry region. Consequently, after the substrate is dried, the particles never remain on the upper surface of the substrate. Therefore, it is possible to dry the whole area of the upper surface of the substrate while reducing or preventing the particles from being generated.

In a preferred embodiment of the present invention, the substrate processing apparatus further includes a closed chamber that has an internal space closed from outside and that houses the substrate holding unit in the internal space.

According to this arrangement, it is possible to bring the whole area of the internal space of the closed chamber into a vapor atmosphere by containing the substrate in the internal space of the closed chamber. Therefore, it is possible to reliably keep the surroundings of the entire upper surface of the substrate in a vapor atmosphere.

Also, it is possible to bring the internal space of the closed chamber into a vapor atmosphere by only existence a liquid of a low surface tension liquid in the internal space of the closed chamber.

Also, the first gas supply unit may include an internal-gas supply unit that supplies the gas to the internal space.

According to this arrangement, it is possible to bring the whole area of the internal space of the closed chamber into a vapor atmosphere by supplying a gas containing a vapor of a low surface tension liquid from the internal-gas supply unit to the internal space. This makes it possible to easily realize an arrangement in which the surroundings of the entire upper surface of the substrate are kept in a vapor atmosphere.

Also, the first gas supply unit may further include a nozzle that discharges a liquid of the low surface tension liquid and a low surface tension liquid supply unit that supplies the liquid of the low surface tension liquid to the nozzle, and the substrate processing apparatus may further include a storage container that is capable of receiving the liquid of the low surface tension liquid discharged from the nozzle and that is capable of storing the liquid.

According to this arrangement, it is possible to bring the whole area of the internal space of the closed chamber into a vapor atmosphere by use of a vapor of a low surface tension liquid generated by the evaporation of the liquid of the low surface tension liquid stored in the storage container. This makes it possible to easily realize an arrangement in which the surroundings of the entire upper surface of the substrate are kept in a vapor atmosphere.

The substrate processing apparatus may further include a chamber that houses the substrate holding unit and a facing member that has a facing surface that faces the upper surface of the substrate, and the first gas supply unit may include a first gas discharge port that is opened in the facing surface and that discharges the gas, and the gas discharge nozzle may have a second gas discharge port that is opened in the facing surface.

According to this arrangement, a vapor of a low surface tension liquid discharged from the gas discharge port is supplied to a space between the facing surface and the upper surface of the substrate. It is possible to keep the surroundings of the entire upper surface of the substrate in a vapor atmosphere by bringing the whole area of the space into a vapor atmosphere.

The facing member may have a facing peripheral edge that faces a peripheral edge of the upper surface of the substrate and that forms a narrow interval that is narrower than an interval between a central part of the facing surface and a central part of the upper surface of the substrate between the peripheral edge of the upper surface and the facing member.

According to this arrangement, a narrow interval is formed between the facing peripheral edge of the facing member and the peripheral edge of the upper surface of the substrate, and therefore the vapor of the low surface tension liquid supplied to a space between the facing surface and the upper surface of the substrate is not easily discharged from the space. Therefore, it is possible to further restrain the vapor of the low surface tension liquid from flowing out from the space. This makes it possible to more reliably keep the surroundings of the entire upper surface of the substrate in a vapor atmosphere.

The second gas discharge port is formed in a region that faces the central part of the substrate, and the first gas discharge port may be dispersedly arranged in a form of a plurality of gas discharge ports in a region excluding a formation position at which the second gas discharge port is formed.

According to this arrangement, the second gas discharge port is dispersedly arranged in the form of a plurality of gas discharge ports, and therefore it is possible to evenly supply a gas from the second gas discharge port to the liquid film of the processing liquid on the substrate. In this case, it is also possible to make the discharge pressure of the gas from each of the second gas discharge ports mutually even, hence making it possible to reliably prevent the liquid film of the processing liquid from being deformed by being pressed by the discharge pressure of the gas. In other words, the second gas discharge port dispersedly arranged in the form of a plurality of gas discharge ports is a mode that does not have local directivity with respect to the upper surface of the substrate.

The aforementioned or other objects, features, and effects of the present invention will be clarified by the following description of preferred embodiments given below with reference to the accompanying drawings.

BRIEF DESCRIPTION OF DRAWINGS

FIG. 5 is a time chart to describe the details of a rinse step (S3 of FIG. 4) and a spin dry step (S4 of FIG. 4) that are executed in the substrate processing apparatus.

FIGS. 6A and 6B are illustrative cross-sectional views for describing a situation of a puddle rinse step (T1 of FIG. 5).

FIGS. 6E and 6F are illustrative cross-sectional views for describing a situation of the dry region expanding step (T3 of FIG. 5).

FIG. 7 is an enlarged cross-sectional view showing a state of a liquid film of water during the dry region expanding step.

FIGS. 9A and 9B are plan views, each showing a state of the inner peripheral part of the liquid film of water during the expansion of a dry region.

FIG. 10 is a view showing a flow distribution model in a gas-liquid-solid interface of a liquid film of water on an upper surface of a substrate according to a reference example.

FIG. 15B is a bottom view of a facing member.

DESCRIPTION OF EMBODIMENTS

Figure 1:
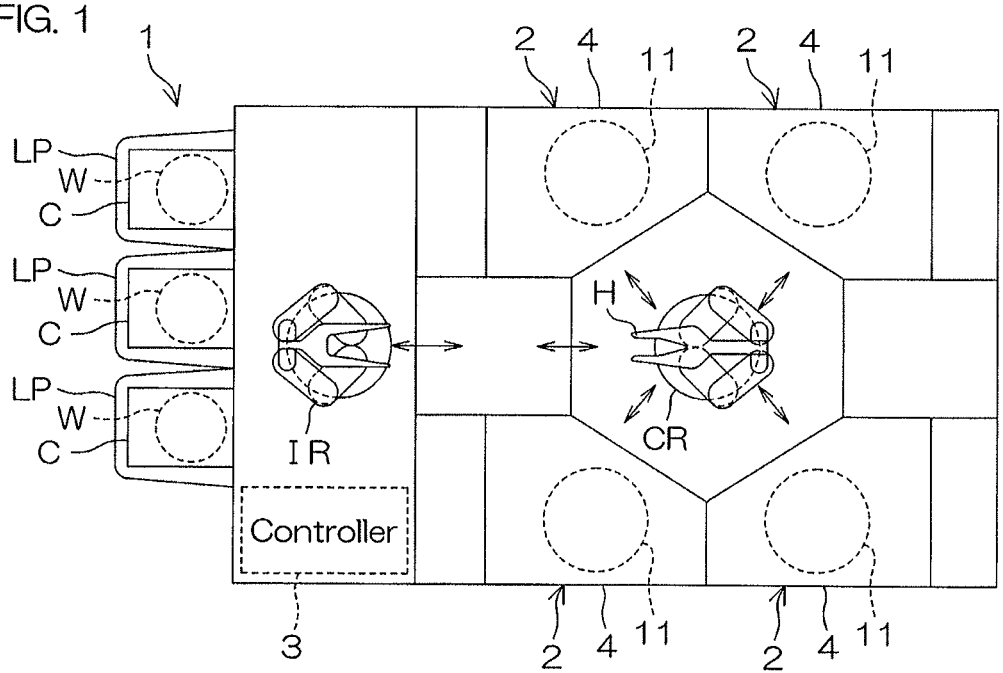
FIG. 1 is an illustrative plan view for describing a layout of the inside of a substrate processing apparatus according to a first preferred embodiment of the present invention.

FIG. 1 is an illustrative plan view for describing a layout of the inside of a substrate processing apparatus according to a first preferred embodiment of the present invention. The substrate processing apparatus 1 is a single substrate processing type apparatus that processes substrates W, such as silicon wafers, one by one. In the present preferred embodiment, the substrate W is a disk-shaped substrate. The substrate processing apparatus 1 includes a plurality of processing units 2 each of which processes a substrate W by use of a processing liquid, a load port LP at which a carrier C containing each of a plurality of substrates W that are processed by the processing units 2 is placed, transfer robots IR and CR each of which transfers a substrate W between the load port LP and the processing unit 2, and a controller 3 that controls the substrate processing apparatus 1. The transfer robot IR transfers a substrate W between the carrier C and the transfer robot CR. The transfer robot CR transfers a substrate W between the transfer robot IR and the processing unit 2. The plurality of processing units 2 each have, for example, the same arrangement.

Figure 2:
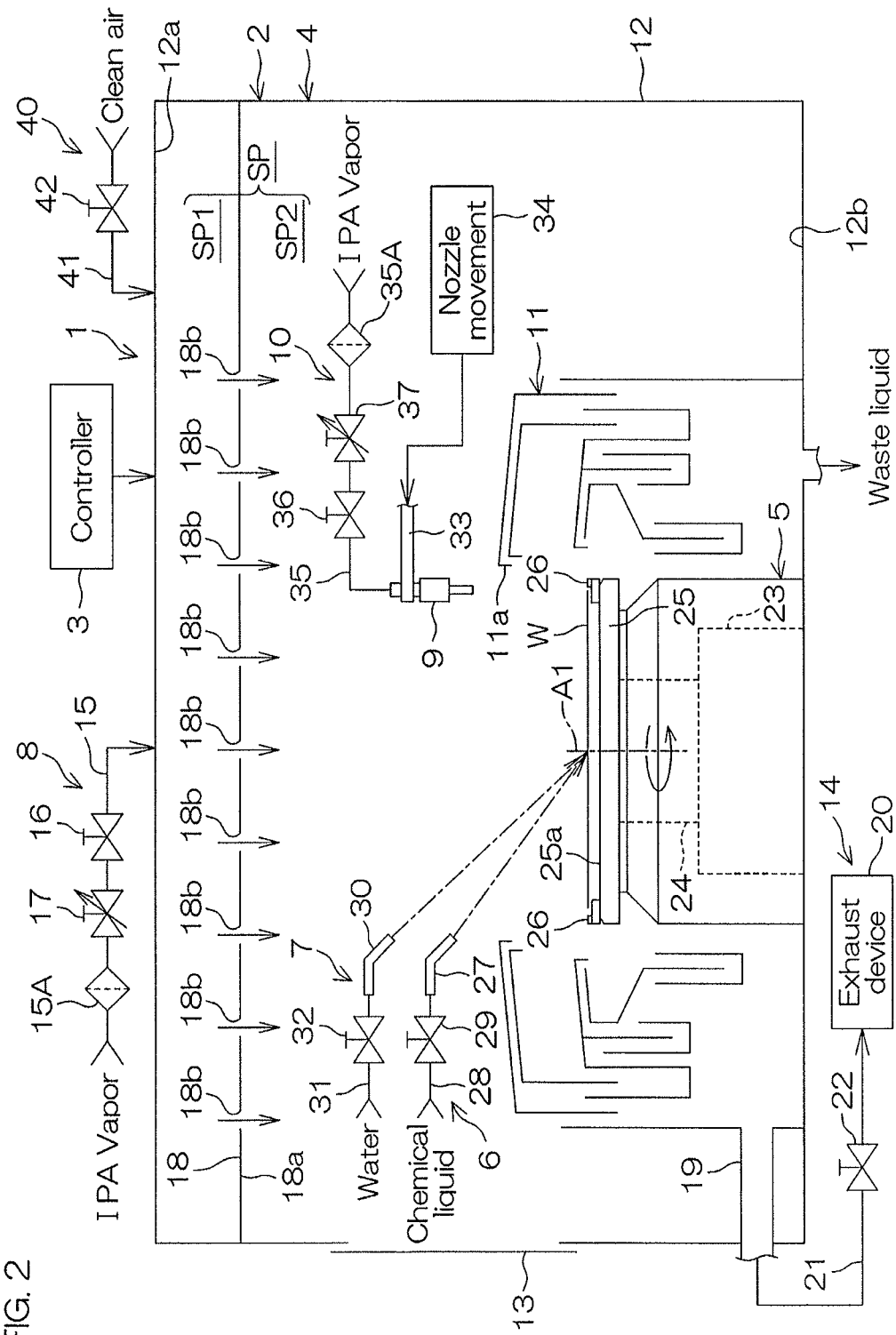
FIG. 2 is an illustrative cross-sectional view for describing an arrangement example of a processing unit included in the substrate processing apparatus.

FIG. 2 is an illustrative cross-sectional view for describing an arrangement example of the processing unit 2.

The processing unit 2 includes a box-shaped processing chamber (closed chamber) 4 that has an internal space SP, a spin chuck (substrate holding unit) 5 that rotates a substrate W around a vertical rotational axis A1 passing through the center of the substrate W while holding the single substrate W in a horizontal attitude in the processing chamber 4, a chemical-liquid supply unit 6 that supplies a chemical liquid to the upper surface of the substrate W held by the spin chuck 5, a water supply unit (processing liquid supply unit) 7 that supplies water (processing liquid) to the upper surface of the substrate W held by the spin chuck 5, an organic-solvent-vapor supply unit (internal-gas supply unit, first gas supply unit) 8 that supplies an IPA vapor, which is an example of an organic solvent vapor serving as a low surface tension liquid, to the internal space SP, a gas discharge nozzle 9 that discharges a gas toward the upper surface of the substrate W held by the spin chuck 5, a nozzle-gas supply unit 10 that supplies a vapor (IPA vapor) of an organic solvent serving as a low surface tension liquid to the gas discharge nozzle 9 in the internal space SP, and a cylindrical processing cup 11 that surrounds the spin chuck 5.

The processing chamber 4 includes a box-shaped partition wall 12 that houses the spin chuck 5 and the like, a blowing unit 40 that sends clean air (air) from an upper part of the partition wall 12 to the inside of the partition wall 12 (equivalent to the inside of the processing chamber 4), a shutter 13 that opens or closes a carry-out/carry-in port formed in the partition wall 12, and an exhaust unit 14 that discharges gases existing in the processing chamber 4 from a lower part of the partition wall 12.

The blowing unit 40 is disposed above the partition wall 12, and is attached to a ceiling of the partition wall 12, and sends clean air from the ceiling to the inside of the processing chamber 4. The blowing unit 40 includes a clean-air pipe 41 through which clean air flows and a clean-air valve 42 that executes switching between the supply and the supply stoppage of an organic solvent vapor (IPA vapor) from the clean-air pipe 41 to the internal space SP. A downstream end of the clean-air pipe 41 is connected to the internal space SP. When the clean-air valve 42 is opened, clean air is sent to the internal space SP through the clean-air pipe 41.

The organic-solvent-vapor supply unit 8 is disposed above the partition wall 12, and is attached to the ceiling of the partition wall 12. The organic-solvent-vapor supply unit 8 includes a first organic-solvent-vapor pipe 15 through which an organic solvent vapor flows. A downstream end of the first organic-solvent-vapor pipe 15 is connected to the internal space SP. The organic-solvent-vapor supply unit 8 further includes a first organic-solvent-vapor valve 16 that executes switching between the supply and the supply stoppage of an organic solvent vapor from the first organic-solvent-vapor pipe 15 to the internal space SP, a first flow regulating valve 17 that regulates the flow rate of an organic solvent vapor to be supplied to the internal space SP while adjusting the opening degree of the first organic-solvent-vapor pipe 15, and a first filter 15A that captures dust and dirt that are included in an organic solvent vapor flowing through the first organic-solvent-vapor pipe 15. The first flow regulating valve 17 includes a valve body (not shown) in which a valve seat is disposed, a valving element (not shown) that opens or closes the valve seat, and an actuator (not shown) that moves the valving element between an open position and a closed position. The same applies to other flow regulating valves.

When the first organic-solvent-vapor valve 16 is opened, an organic solvent vapor (clean organic solvent vapor from which dust and dirt have been removed) is sent to the internal space SP through the first organic-solvent-vapor pipe 15.

The processing chamber 4 includes a rectifying plate 18 that rectifies a gas (clean air or organic solvent vapor) supplied to the internal space SP by means of the organic-solvent-vapor supply unit 8. The rectifying plate 18 is disposed in the internal space SP, and, the rectifying plate that is disposed at a height between the organic-solvent-vapor supply unit 8 and the spin chuck 5. The rectifying plate 18 is held in a horizontal attitude. The rectifying plate 18 partitions the inside of the partition wall 12 into a space SP1 above the rectifying plate 18 and a space SP2 below the rectifying plate 18. The upper space SP1 between a ceiling surface 12a of the partition wall 12 and the rectifying plate 18 is a diffusion space in which a supplied gas (clean air or organic solvent vapor) diffuses, whereas the lower space SP2 between the rectifying plate 18 and a floor surface 12b of the partition wall 12 is a processing space in which the substrate W is processed. The height of the upper space SP1 is smaller than that of the lower space SP2. A lower surface 18a of the rectifying plate 18 includes a facing portion that coincides with the spin chuck in a plan view. The rectifying plate 18 includes a porous plate having a plurality of through-holes 18b passing therethrough in an up-down direction that are formed in its whole area.

When the clean-air valve 42 is opened in a state in which the first organic-solvent-vapor valve 16 is closed, clean air is sent to the upper space SP1. The upper space SP1 is filled with clean air by continuously opening the clean-air valve 42, and the clean air passes through the through-holes 18b, and flows downwardly from the whole area of the rectifying plate 18. Accordingly, a uniform flow of the clean air running downwardly from the whole area of the rectifying plate 18 is formed in the lower space SP2.

On the other hand, when the first organic-solvent-vapor valve 16 is opened in a state in which the clean-air valve 42 is closed, an organic solvent vapor is sent to the upper space SP1. The upper space SP1 is filled with the organic solvent vapor by continuously opening the first organic-solvent-vapor valve 16, and the organic solvent vapor passes through the through-holes 18b, and flows downwardly from the whole area of the rectifying plate 18. Accordingly, a uniform flow of the organic solvent vapor running downwardly from the whole area of the rectifying plate 18 is formed in the lower space SP2.

The exhaust unit 14 includes an exhaust duct 19 connected to the processing cup 11, an exhaust device 20, such as a suction device, that sucks an atmosphere of the internal space SP of the processing chamber 4 through the exhaust duct 19, an exhaust pipe 21 by which the exhaust duct 19 and the exhaust device 20 are connected together, and an exhaust valve 22 that opens and closes the exhaust pipe 21. In a state in which the exhaust valve 22 is opened, the atmosphere of the internal space SP (lower space SP2) is discharged outwardly from the processing chamber 4, and a downward flow is generated in the internal space SP (lower space SP2). On the other hand, in a state in which the exhaust valve 22 is closed, the atmosphere of the internal space SP (lower space SP2) is not discharged outwardly from the processing chamber 4.

When the exhaust valve 22 is closed in a state in which the clean-air valve 42 is closed, the internal space SP is brought into a closed state of being closed from the outside, and the processing chamber 4 functions as a closed chamber closed from the outside.

A clamping-type chuck that grips a substrate W in a horizontal direction and that holds the substrate W horizontally is employed as the spin chuck 5. More specifically, the spin chuck 5 includes a spin motor 23, a spin shaft 24 integrally united with a driving shaft of the spin motor 23, and a disk-shaped spin base 25 substantially horizontally attached to an upper end of the spin shaft 24.

The spin base 25 includes a horizontal circular upper surface 25a that has an outer diameter larger than that of the substrate W. The upper surface 25a has its peripheral edge at which a plurality of (three or more, e.g., six) clamping members 26 are disposed. The plurality of clamping members 26 are disposed at appropriate intervals, e.g., at equal intervals therebetween on a circumference corresponding to the shape of the outer periphery of the substrate W in the peripheral edge of the upper surface of the spin base 25.

The chemical-liquid supply unit 6 includes a chemical liquid nozzle 27. The chemical liquid nozzle 27 includes, for example, a straight nozzle that discharges a liquid in a continuous flow state, and is fixedly disposed above the spin chuck 5 while directing its discharge port toward a central part of the upper surface of the substrate W. A chemical liquid pipe 28 through which a chemical liquid is supplied from a chemical-liquid supply source is connected to the chemical liquid nozzle 27. A chemical liquid valve 29 by which switching is executed between the supply and the supply stoppage of a chemical liquid from the chemical liquid nozzle 27 is interposed in the chemical liquid pipe 28. When the chemical liquid valve 29 is opened, a continuously-flowing chemical liquid that has been supplied from the chemical liquid pipe 28 to the chemical liquid nozzle 27 is discharged from the discharge port formed at a lower end of the chemical liquid nozzle 27. When the chemical liquid valve 29 is closed, the supply of a chemical liquid from the chemical liquid pipe 28 to the chemical liquid nozzle 27 is stopped.

Concrete examples of the chemical liquid are an etching liquid and a cleaning liquid. More specifically, the chemical liquid may be hydrofluoric acid, SC1 (ammonia hydrogen peroxide water mixture), SC2 (hydrochloric acid hydrogen peroxide water mixture), ammonium fluoride, or buffered hydrofluoric acid (mixture of hydrofluoric acid and ammonium fluoride).

The water supply unit 7 includes a water nozzle 30. The water nozzle 30 is, for example, a straight nozzle that discharges a liquid in a continuous flow state, and is fixedly disposed above the spin chuck 5 while directing its discharge port toward the central part of the upper surface of the substrate W. A water pipe 31 through which water is supplied from a water supply source is connected to the water nozzle 30. A water valve 32 by which switching is executed between the supply and the supply stoppage of water from the water nozzle 30 is interposed in the water pipe 31. When the water valve 32 is opened, continuously-flowing water that has been supplied from the water pipe 31 to the water nozzle 30 is discharged from the discharge port formed at a lower end of the water nozzle 30. When the water valve 32 is closed, the supply of water from the water pipe 31 to the water nozzle 30 is stopped. Water supplied to the water nozzle 30 is, for example, deionized water (DIW), and yet, without being limited to DIW, it may be any one of soda water, electrolyzed ion water, hydrogenated water, ozone water, and hydrochloric acid water having a diluted concentration (for example, about 10 ppm to 100 ppm).

Also, the chemical liquid nozzle 27 and the water nozzle 30 are not necessarily required to be each disposed fixedly with respect to the spin chuck 5, and, for example, a so-called scanning nozzle type may be employed in which the chemical liquid nozzle 27 and the water nozzle 30 are attached to an arm swingable in a horizontal plane above the spin chuck 5 and in which the landing position of a processing liquid (chemical liquid or water) that has landed on the upper surface of the substrate W is scanned by the swing of the arm.

The gas discharge nozzle 9 includes, for example, a straight nozzle that discharges a liquid in a continuous flow state, and is attached to a forward end of a first nozzle arm 33 that extends horizontally. A first nozzle-moving unit 34 that moves the gas discharge nozzle 9 by moving the first nozzle arm 33 is joined to the first nozzle arm 33.

The gas discharge nozzle 9 has a discharge port 9a (see FIG. 7) formed at a lower end of a nozzle pipe.

The nozzle-gas supply unit 10 includes a second organic-solvent-vapor pipe 35 connected to the gas discharge nozzle 9, a second organic-solvent-vapor valve 36 that is interposed in the second organic-solvent-vapor pipe 35 and that executes switching between the supply and the supply stoppage of an organic solvent vapor from the second organic-solvent-vapor pipe 35 to the gas discharge nozzle 9, a second flow regulating valve 37 that is interposed in the second organic-solvent-vapor pipe 35 and that regulates the flow rate of an organic solvent vapor discharged from the gas discharge nozzle 9 while adjusting the opening degree of the second organic-solvent-vapor pipe 35, and a second filter 35A that captures dust and dirt that are included in an organic solvent vapor flowing through the second organic-solvent-vapor pipe 35. When the second organic-solvent-vapor valve 36 is opened, an organic solvent vapor (clean organic solvent vapor from which dust and dirt have been removed) from an organic-solvent-vapor supply source is discharged downwardly from the discharge port 9a (see FIG. 7) of the gas discharge nozzle 9.

As shown in FIG. 2, the processing cup 11 is disposed at a more outward position (in a direction away from the rotational axis A1) than the substrate W held by the spin chuck 5. The processing cup 11 surrounds the spin base 25. When a processing liquid is supplied to the substrate W in a state in which the spin chuck 5 is rotating the substrate W, the processing liquid that has been supplied to the substrate W is spun off toward the surroundings of the substrate W. When a processing liquid is supplied to the substrate W, an upper end 11a of the processing cup 11 that is upwardly open is disposed at a higher position than the spin base 25. Therefore, processing liquids, such as a chemical liquid and water, which have been discharged toward the surroundings of the substrate W, are received by the processing cup 11. Thereafter, the processing liquids received by the processing cup 11 are sent to a recovery device or a waste fluid device (not shown).

Figure 3:
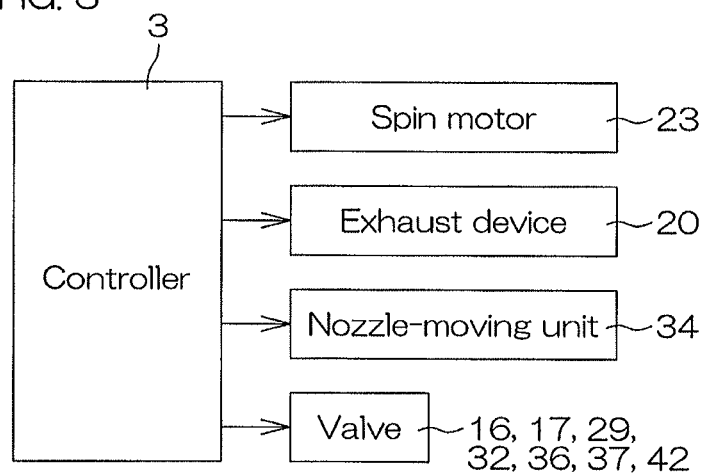
FIG. 3 is a block diagram for describing an electric arrangement of a main part of the substrate processing apparatus.

FIG. 3 is a block diagram for describing an electric arrangement of a main part of the substrate processing apparatus 1.

The controller 3 controls the operations of the spin motor 23, the exhaust device 20, the first nozzle-moving unit 34, etc., in accordance with a predetermined program. The controller 3 further controls the open-close operations and the like of the chemical liquid valve 29, the water valve 32, the first organic-solvent-vapor valve 16, the first flow regulating valve 17, the second organic-solvent-vapor valve 36, the second flow regulating valve 37, the clean-air valve 42, etc.

Figure 4:
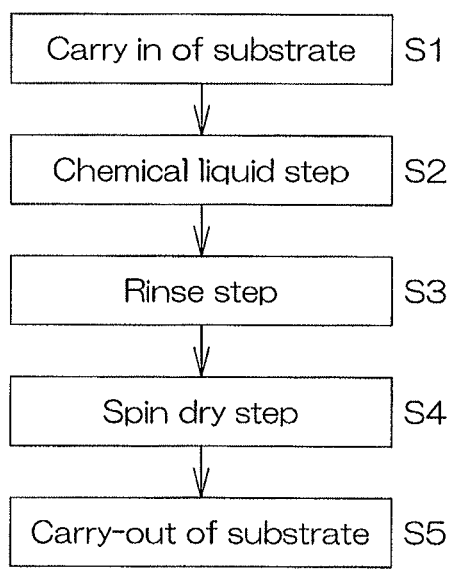
FIG. 4 is a flowchart for describing an example of substrate processing executed by the substrate processing apparatus.

FIG. 4 is a flowchart for describing an example of substrate processing executed by the substrate processing apparatus 1. FIG. 5 is a time chart to describe a rinse step (S3) and a spin dry step (S4) that are executed in the substrate processing apparatus 301. FIGS. 6A to 6F are illustrative views for describing a puddle rinse step T1, a dry region forming step T2, and a dry region expanding step T3.

Substrate processing will be described with reference to FIG. 1 to FIG. 6F.

A substrate W that has not yet been processed is carried into the processing unit 2 from the carrier C by means of the transfer robots IR and CR, and is then carried into the processing chamber 4, and is then delivered to the spin chuck 5 in a state in which a front surface (to-be-processed surface, e.g., a pattern forming surface) of the substrate W is directed upwardly, and is held by the spin chuck 5 (S1:

substrate carrying-in step (substrate holding step)). Prior to the carry in of the substrate W, the gas discharge nozzle 9 is retreated to a home position set on the lateral side of the spin chuck 5. Also, prior to the carry in of the substrate W, the first organic-solvent-vapor valve 16 is closed, and the clean-air valve 42 is opened, and the exhaust valve 22 is opened. Therefore, in the internal space SP (lower space SP2), a downward flow of clean air is formed in the lower space SP2.

The transfer robot CR retreats outwardly from the processing unit 2, and then the controller 3 executes a chemical liquid step (step S2). More specifically, the controller 3 drives the spin motor 23, and rotates the spin base 25 at a predetermined liquid treatment speed (e.g., about 800 rpm). The controller 3 further opens the chemical liquid valve 29. As a result, a chemical liquid is supplied from the chemical liquid nozzle 27 to the upper surface of the substrate W being in a rotational state. The chemical liquid supplied thereto spreads over the entire surface of the substrate W by means of a centrifugal force, and the substrate W undergoes chemical liquid treatment by use of the chemical liquid. When a predetermined period of time elapses from the start of discharging the chemical liquid, the controller 3 closes the chemical liquid valve 29, and stops the discharge of the chemical liquid from the chemical liquid nozzle 27.

Thereafter, the controller 3 executes the rinse step (step S3). The rinse step is a step of replacing the chemical liquid on the substrate W with water and excluding the chemical liquid from the surface of the substrate W. More specifically, the controller 3 opens the water valve 32. As a result, water is supplied from the water nozzle 30 to the upper surface of the substrate W being in a rotational state. The water supplied thereto spreads over the entire surface of the substrate W by means of a centrifugal force. The chemical liquid adhering to the surface of the substrate W is rinsed away with this water.

When a predetermined period of time elapses from the start of supplying water, the controller 3 controls the spin motor 23 in a state in which the entire upper surface of the substrate W is covered with water, and the controller 3 stepwisely reduces the rotation speed of the substrate W from the liquid treatment speed to a puddle speed (zero or low rotation speed of about 40 rpm or less, e.g., about 10 rpm). Thereafter, the rotation speed of the substrate W is maintained at the puddle speed (puddle rinse step T1). Accordingly, a liquid film of water with which the entire upper surface of the substrate W is covered is supported in a puddle state on the upper surface of the substrate W as shown in FIG. 6A. In this state, a centrifugal force acting on the liquid film 50 of water on the upper surface of the substrate W is smaller than surface tension acting between water and the upper surface of the substrate W, or the centrifugal force and the surface tension act with a substantially equal force. The centrifugal force acting on water on the substrate W is weakened by decelerating the substrate W, and the amount of water scattered from the surface of the substrate W decreases. The rinse step is executed subsequent to the chemical liquid step of removing particles from the upper surface of the substrate W by use of a chemical liquid, and therefore there is a possibility that particles will be included in the liquid film 50 of water. Also, in the puddle rinse step T1, the supply of water to the substrate W may be continuously executed after the liquid film 50 of water being in a puddle state appears.

Furthermore, the controller 3 closes the clean-air valve 42 in synchronization with the start of the puddle rinse step T1, and opens the first organic-solvent-vapor valve 16. Consequently, the supply of clean air to the internal space SP is stopped, and the supply of an organic solvent vapor to the internal space SP is started. Consequently, the organic solvent vapor is supplied to the lower space SP2 through the through-holes 18*b* (see FIG. 2). The controller 3 further closes the exhaust valve 22. Consequently, the internal space SP of the processing chamber 4 is closed from the outside, and the processing chamber 4 functions as a closed chamber. In this state, the lower space SP2 (space that includes a space above the substrate W) is blocked from the outside of the processing chamber 4 (blocking step), and therefore an organic solvent vapor supplied to the lower space SP2 spreads over the whole area of the lower space SP2, and the lower space SP2 is filled with the organic solvent vapor. As a result, it is possible to fill the surroundings of the liquid film 50 of water on the substrate W with an organic-solvent-vapor atmosphere (vapor atmosphere filling step).

The lower space SP2 blocked from the external space is hardly influenced by a disturbance of an external atmosphere. Therefore, after this, the surroundings of the entire upper surface of the substrate W are kept in an atmosphere containing a highly-concentrated organic solvent vapor (hereinafter, referred to as an "organic-solvent-vapor atmosphere"). After a liquid film 50 of water being in a puddle state is formed, the controller 3 closes the water valve 32, and stops the discharge of water from the water nozzle 30.

Furthermore, when a predetermined timing is reached after the substrate W is decelerated, the controller 3 controls the first nozzle-moving unit 34, and moves the gas discharge nozzle 9 from the home position to a position above the substrate W as shown in FIG. 6B. The gas discharge nozzle 9 is placed above a central part of the upper surface of the substrate W. After the lower space SP2 is filled with an organic solvent vapor, the puddle rinse step T1 is ended (the rinse step (S3) is ended).

Figure 6C:
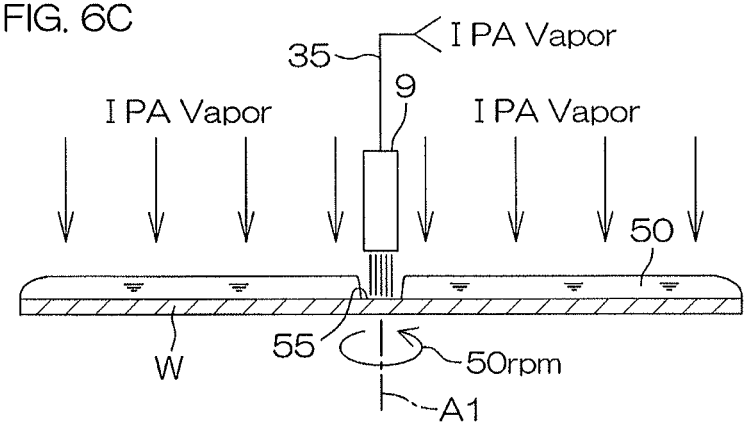
FIGS. 6C and 6D are illustrative cross-sectional views for describing a situation of a dry region forming step (T2 of FIG. 5) and of a dry region expanding step (T3 of FIG. 5).

Thereafter, the controller 3 executes the spin dry step (step S4). More specifically, first, the controller 3 executes the dry region forming step T2. In the words, the dry region forming step T2 is a step of forming a circular dry region 55 from which water has been completely removed at a central part of the liquid film 50 of water of the substrate W as shown in FIG. 6C. More specifically, the controller 3 opens the second organic-solvent-vapor valve 36, and discharges an organic solvent vapor downwardly from the gas discharge nozzle 9 toward the central part of the upper surface of the substrate W, and accelerates the substrate W to a predetermined dry region forming speed (for example, about 50 rpm) while controlling the spin motor 23. An organic solvent vapor is sprayed onto the central part of the liquid film 50 of water of the upper surface of the substrate W, and, as a result, water existing at the central part of the liquid film 50 of water is blown off and is removed from the central part of the upper surface of the substrate W by means of a spray pressure (gas pressure). Furthermore, a comparatively strong centrifugal force acts on the liquid film 50 of water on the substrate W by the fact that the rotation speed of the substrate W has reached the dry region forming speed (for example, about 50 rpm). These make it possible to form the circular dry region 55 at the central part of the upper surface of the substrate W. Although the dry region forming speed has been set at about 50 rpm, its rotation speed may be greater than about 50 rpm.

The whole area of the lower space SP2 is filled with the organic solvent vapor as described above, and therefore, in the dry region forming step T2, parts other than the central part (a forming region of the dry region—55) of the liquid film 50 of water are not deformed because strong discharge pressure of the organic solvent vapor is not applied onto these parts. Therefore, in the dry region forming step T2, it is possible to keep the liquid film 50 (bulk 72) of water as thick as possible. This makes it possible to strengthen Marangoni convection 65 that occurs in an inner peripheral part 70 of the liquid film of water.

The dry region expanding step T3 is executed subsequent to the dry region forming step T2.

Figure 6D:
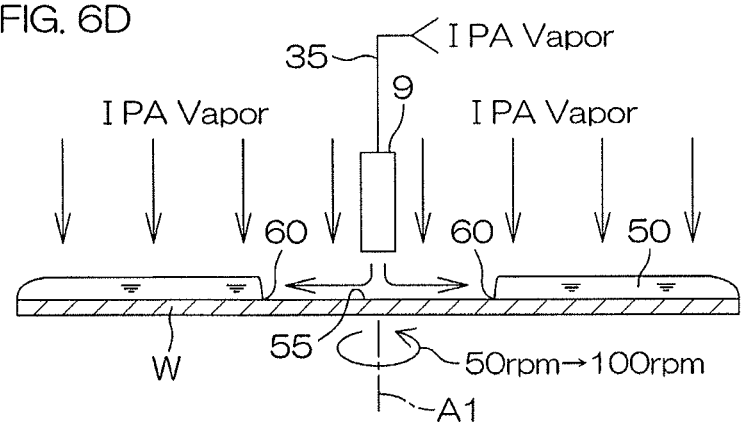

In the dry region expanding step T3, the controller raises the rotation speed of the substrate W to a predetermined dry speed (for example, 1000 rpm) while controlling the spin motor 23. In response to a rise in the rotation speed of the substrate W, the dry region 55 is expanded as shown in FIGS. 6D and 6E. As a result of the expansion of the dry region 55, a gas-liquid-solid interface 60 between the dry region 55 and the upper surface of the substrate W of the liquid film 50 of water is moved outwardly in the radial direction of the substrate W. Thereafter, the dry region 55 is expanded over the whole area of the substrate W as shown in FIG. 6F, and, as a result, the liquid film 50 of water is all discharged outwardly from the substrate W.

In the dry region expanding step T3, parts other than the central part (dry region—55 forming region) of the liquid film 50 of water are not deformed because strong discharge pressure of the organic solvent vapor is not applied onto these parts. Therefore, it is possible to keep the liquid film 50 (bulk 72) of water as thick as possible. This makes it possible to strengthen Marangoni convection 65 that occurs in the inner peripheral part 70 of the liquid film of water.

In the dry region expanding step T3, an organic solvent concentration on a central part of the substrate W is about 2000 ppm or more, and an organic solvent concentration on a peripheral edge of the substrate W is about 120 ppm or more, and an organic solvent concentration on an intermediate part (intermediate position between the central part and the peripheral edge) of the substrate W is about 180 ppm or more.

The organic solvent vapor continues to be supplied from the organic-solvent-vapor supply unit 8 to the internal space SP over the entire period of the dry region expanding step T3. Therefore, the whole area of the upper surface of the substrate W is kept in the organic solvent vapor over the entire period of the dry region expanding step T3. Therefore, it is possible to keep the atmosphere around the inner peripheral part 70 of the liquid film of water as an organic-solvent-vapor atmosphere irrespective of an expansion situation of the dry region 55.

After the dry region 55 is expanded to the whole area of the upper surface of the substrate W, the controller 3 ends the dry region expanding step T3. According to the end of the dry region expanding step T3, the controller 3 closes the first and second organic-solvent-vapor valves 16 and 36, and stops the supply of the organic solvent vapor from the organic-solvent-vapor supply unit 8 to the internal space SP, and stops the discharge of the organic solvent vapor from the gas discharge nozzle 9. Also, the controller 3 opens the clean-air valve 42 and the exhaust valve 22, and hence forms a downward flow of clean air in the internal space SP (lower space SP2). Consequently, the atmosphere of the internal space SP (lower space SP2) is replaced and changed from the organic solvent vapor to clean air.

Thereafter, the controller 3 allows the substrate W to be continuously rotated without changing a speed of about 1000 rpm (open high speed rotation step). Consequently, fresh, clean air taken into the lower space SP2 comes into contact with the upper surface of the substrate W. Therefore, the diffusion of a water vapor progresses at different places of the upper surface of the substrate W, and, as a result, the evaporation of water progresses at these different places. Also, it is possible to shake off water on the upper surface of the substrate W by the high speed rotation of the substrate W. This makes it possible to excellently dry the upper surface of the substrate W.

When a predetermined period of time elapses from the start of the spin dry step (S4), the controller 3 stops the rotation of the spin chuck 5 while controlling the spin motor 23. Thereafter, the transfer robot CR enters the processing unit 2, and executes an already-processed substrate W outwardly from the processing unit 2 (step S5). The substrate W is delivered from the transfer robot CR to the transfer robot IR, and is stored in the carrier C by means of the transfer robot IR.

FIG. 7 is an enlarged cross-sectional view showing a state of the liquid film of water during the dry region expanding step T3.

A gas is discharged downwardly from the gas discharge nozzle 9. When the substrate W is processed by the substrate processing apparatus 1, the discharge port 9a of the gas discharge nozzle 9 is placed at a lower position at which the discharge port 9a faces the upper surface of the substrate W with a predetermined interval W1 (for example, about 10 mm) therebetween. When the second organic-solvent-vapor valve 36 (see FIG. 2) is opened in this state, an organic solvent vapor discharged from the discharge port 9a is sprayed onto the upper surface of the substrate W. Consequently, water at the central part of the liquid film 50 of water is physically pressed and expanded by a spray pressure (gas pressure), and is blown off and is removed from the central part of the upper surface of the substrate W. As a result, a dry region 55 is formed at the central part of the upper surface of the substrate W. The dry region 55 is a region in which a liquid does not exist in the form of liquid droplets or in the form of a film.

In a state in which the internal space SP is filled with the organic solvent vapor, the surroundings of the whole area of the liquid film 50 of water with which the upper surface of the substrate W is covered are kept in an organic-solvent-vapor atmosphere. Therefore, after the dry region 55 is formed, it is possible to keep the atmosphere around the inner peripheral part 70 of the liquid film of water as an organic-solvent-vapor atmosphere. Therefore, Marangoni convection 65 that flows from the gas-liquid-solid interface 60 toward the bulk 72 occurs inside the inner peripheral part 70 of the liquid film of water because of a difference in the concentration of the organic solvent based on a local difference in thickness of the liquid film of water.

Also, the organic solvent vapor discharged from the discharge port 9a flows in a radial direction and in a horizontal direction along the upper surface of the substrate W.

Figure 8:
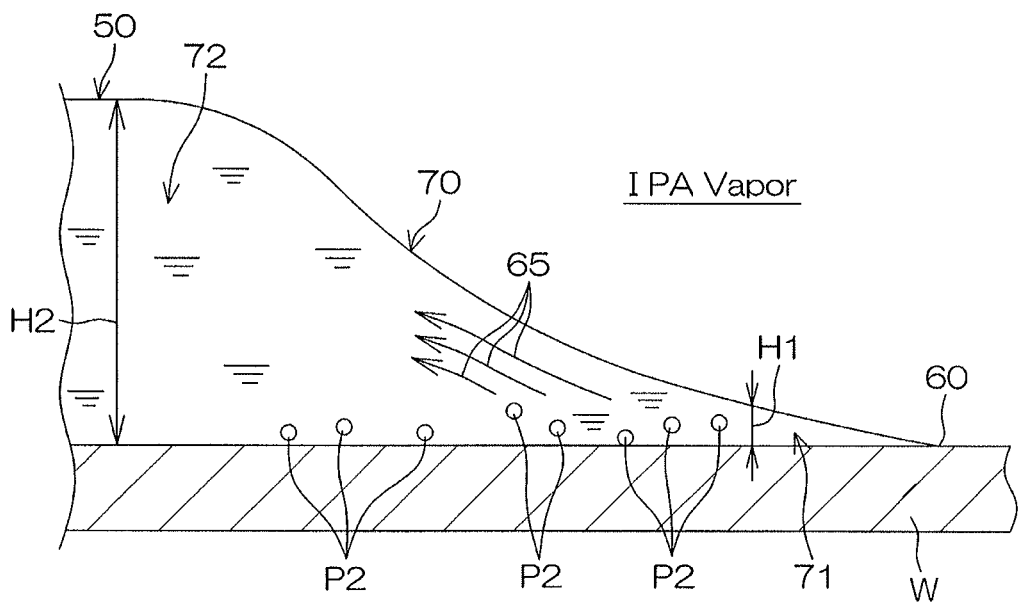
FIG. 8 is a view for describing a generation mechanism of Marangoni convection inside an inner peripheral part of a liquid film of water.

FIG. 8 is a view for describing a generation mechanism of the Marangoni convection 65 inside the inner peripheral part 70 of the liquid film of water.

In a state in which the substrate W is rotating and in which the dry region 55 (see FIG. 7) is formed in the liquid film 50 of water, parts that differ in thickness from each other are formed in the liquid film 50 of water because of a centrifugal force generated by the rotation of the substrate W. More specifically, the thickness H1 of the liquid film is very small in a region 71 of the liquid film 50 of water that is near the gas-liquid-solid interface 60 (hereinafter, referred to simply as a "near-interface region 71"), whereas the thickness H2 of the liquid film is large in the bulk 72 of the liquid film 50 of water (H2>H1). For example, H1=several nanometers (nm), and H2=about 7 millimeters (mm).

The surroundings of a surface part of the inner peripheral part 70 of the liquid film of water are kept in a highly-concentrated state of an organic solvent vapor. In this state, the organic solvent vapor evenly merges into different places of the surface part of the inner peripheral part 70 of the liquid film of water. In the inner peripheral part 70 of the liquid film of water, the thickness H1 of the near-interface region 71 is smaller than the thickness H2 of the bulk 72, and therefore the organic solvent concentration in the near-interface region 71 is relatively higher than the organic solvent concentration in the bulk 72. As a result, a concentration gradient occurs inside the inner peripheral part 70 of the liquid film of water, and, as a result, Marangoni convection 65 that flows from the near-interface region 71 toward the bulk 72 occurs. This Marangoni convection 65 cancels heat convection 76 (see FIG. 10) generated in a second part 70B (see FIG. 10) described later, and, without being limited to only this, the Marangoni convection 65 also makes anew flow, which runs from the near-interface region 71 toward the bulk 72, in the second part 70B (see FIG. 10). Therefore, in a case in which microscopic particles P2 are included in the inner peripheral part 70 (more specifically, the second part 70B of FIG. 10) of the liquid film of water, a strong force in a direction from the near-interface region 71 toward the bulk 72, i.e., in a direction away from the gas-liquid-solid interface 60 acts on the microscopic particles P2 while receiving the Marangoni convection 65 as shown in FIG. 8. Consequently, the microscopic particles P2 included in the near-interface region 71 are moved outwardly in the radial direction (in the direction away from the gas-liquid-solid interface 60).

FIGS. 9A and 9B are plan views, each showing a state of the inner peripheral part 70 of the liquid film of water during the expansion of the dry region 55. FIG. 9A shows a state in which the microscopic particles P2 are included in the inner peripheral part 70 (more specifically, the second part 70B of FIG. 10) of the liquid film of water. The microscopic particles P2 are arranged along the line of the gas-liquid-solid interface 60.

In this case, the microscopic particles P2 included in the inner peripheral part 70 (second part 70B) of the liquid film of water receive the Marangoni convection 65 (see FIG. 7) flowing in the direction away from the gas-liquid-solid interface 60, and are moved outwardly in the radial direction (in the direction away from the gas-liquid-solid interface 60), and, as a result, are taken into the bulk 72 of the liquid film 50 of water. Thereafter, with the expansion of the dry region 55, the gas-liquid-solid interface 60 is moved outwardly in the radial direction of the substrate W (in the direction toward the bulk 72), and the dry region 55 is expanded while the microscopic particles P2 are still being taken in the bulk 72. In other words, when the gas-liquid-solid interface 60 is moved outwardly in the radial direction of the substrate W with the expansion of the dry region 55, the microscopic particles P2 are also moved outwardly in the radial direction in response to that movement as shown in FIG. 9B.

Thereafter, the dry region 55 is expanded to the whole area of the substrate W, and the liquid film 50 of water is completely discharged from the upper surface of the substrate W (a state shown in FIG. 6F), and, as a result, the whole area of the upper surface of the substrate W is dried. The microscopic particles P2 included in the bulk 72 of the liquid film 50 of water are removed from the upper surface of the substrate W together with the liquid film 50 of water without appearing in the dry region 55.

As described above, according to the present preferred embodiment, the dry region forming step T2 and the dry region expanding step T3 are successively executed while the surroundings of the whole area of the liquid film 50 of water with which the upper surface of the substrate W is covered are filled with the organic-solvent-vapor atmosphere. Therefore, it is possible to keep the surroundings of the inner peripheral part 70 of the liquid film of water in a vapor atmosphere (IPA vapor) to the end of the expansion of the dry region 55 irrespective of an expansion situation of the dry region 55. When the substrate W is rotated in a state in which the surroundings of the inner peripheral part 70 of the liquid film of water are kept in a vapor atmosphere, Marangoni convection 65 flowing in the direction away from the gas-liquid-solid interface 60 occurs inside the inner peripheral part 70 of the liquid film of water because of a difference in concentration of the organic solvent. Therefore, it is possible to continue to generate Marangoni convection 65 inside the inner peripheral part 70 of the liquid film of water over the entire period of the dry region forming step T2 and the dry region expanding step T3.

Consequently, the microscopic particles P2 included in the inner peripheral part 70 of the liquid film of water receive the Marangoni convection 65, and are moved in a direction toward the bulk 72, i.e., in a direction away from the gas-liquid-solid interface 60, and, as a result, the microscopic particles P2 are taken into the bulk 72 of the liquid film 50 of water. With the expansion of the dry region 55, the gas-liquid-solid interface 60 is moved outwardly in the radial direction of the substrate W (in the direction toward the bulk 72), and the dry region 55 is expanded while the microscopic particles P2 are still being taken in the bulk 72. Thereafter, the microscopic particles P2 taken in the bulk 72 are discharged from the upper surface of the substrate W together with the liquid film 50 of water without appearing in the dry region 55. Consequently, after the substrate W is dried, the microscopic particles P2 never remain on the upper surface of the substrate W. Therefore, it is possible to dry the whole area of the upper surface of the substrate W while reducing or preventing the microscopic particles P2 from being generated.

Also, a great centrifugal force does not act on the substrate W in the puddle rinse step T1, and therefore it is possible to keep the thickness of the liquid film 50 of water formed on the upper surface of the substrate W large. If the thickness of the liquid film 50 of water is large, it is possible to keep the concentration gradient, which occurs in the inner peripheral part 70 of the liquid film of water, of an organic solvent large in the dry region expanding step T3, hence making it possible to strengthen Marangoni convection 65 generated in the inner peripheral part 70 of the liquid film of water.

Also, the substrate W is rotated at a high speed in the dry region expanding step T3, and therefore a strong centrifugal force acts on the substrate W, and it is possible to make a difference in film thickness in the inner peripheral part 70 of the liquid film of water more distinct by means of the centrifugal force. This makes it possible to keep the concentration gradient, which occurs in the inner peripheral part 70 of the liquid film of water, of an organic solvent large, hence making it possible to even further strengthen Marangoni convection 65 generated in the inner peripheral part 70 of the liquid film of water.

Also, a substrate W is contained in the internal space SP of the processing chamber 4 that is a closed chamber, and an organic solvent vapor is supplied from the organic-solvent-vapor supply unit 8 to the internal space SP, and, as a result, it is possible to make the whole area of the internal space SP as an organic-solvent-vapor atmosphere, hence making it possible to reliably keep the surroundings of the entire upper surface of the substrate W in an organic-solvent-vapor atmosphere.

Next, a description will be given of a mechanism in which particles occur resulting from the spin dry step (S4).

FIG. 10 is a view showing a flow distribution model in a gas-liquid-solid interface of a liquid film of water (a liquid film of a processing liquid) 50 on an upper surface of a substrate W according to a reference example.

In this reference example, the puddle rinse step T1, a liquid film removal region forming step (equivalent to the dry region forming step T2), and a liquid film removal region expanding step (equivalent to the dry region expanding step T3) are executed in the same way as in the processing example according to the aforementioned preferred embodiment. However, this reference example differs from the aforementioned preferred embodiment in the fact that the whole area around the upper surface of the substrate W is made not as an organic-solvent-vapor atmosphere but as a dry air atmosphere in the liquid film removal region forming step and in the liquid film removal region expanding step. Also, in this reference example, unlike the aforementioned preferred embodiment, an organic-solvent-vapor atmosphere is not sprayed onto the central part of the upper surface of the substrate W in the dry region forming step T2, and a liquid film removal region 155 (equivalent to the dry region 55 of the aforementioned preferred embodiment) is formed only by a centrifugal force generated by the rotation of the substrate W.

In this case, as shown in FIG. 10, heat convection 76 occurs inside the inner peripheral part 70 of the liquid film of water in the liquid film removal region expanding step. In a first region 70A placed on the bulk—72 side, the heat convection 76 inside the inner peripheral part 70 of the liquid film of water flows in a direction away from the gas-liquid-solid-interface—60 side, and yet, in a second part 70B on the gas-liquid-solid-interface—60 side that includes the near-interface region 71, the heat convection 76 flows from the bulk—72 side to the gas-liquid-solid-interface—60 side as shown in FIG. 10. Therefore, if microscopic particles P2 (see FIGS. 11 to 13A etc.) are included in the second part 70B of the inner peripheral part 70, these microscopic particles P2 will be drawn to the gas-liquid-solid-interface—60 side, and will cohere to the near-interface region 71. It is conceivable that the cohesion of the microscopic particles P2 will be caused not only by the heat convection 76 but also by a Van der Waals force or a Coulomb force between adjoining microscopic particles P2.

Figure 11:
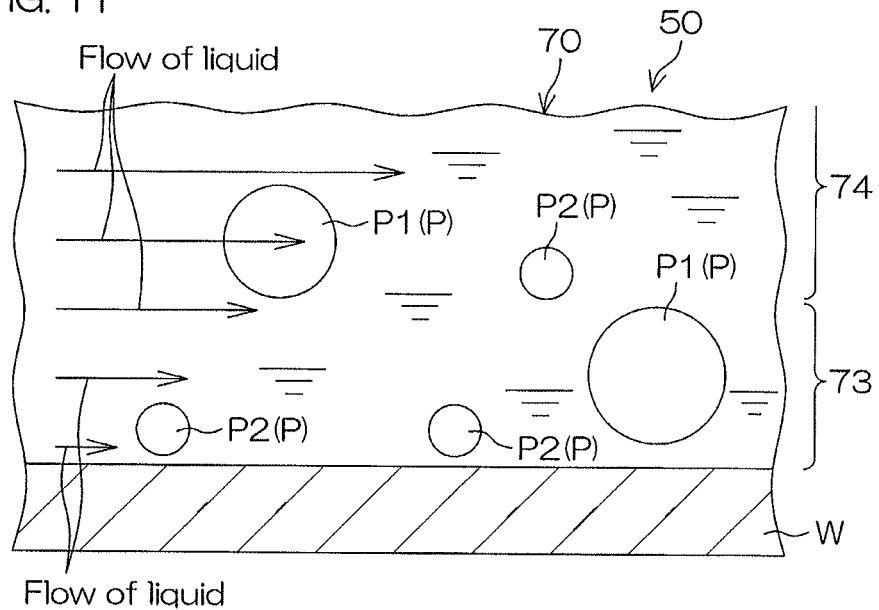
FIG. 11 is a schematic cross-sectional view showing the movement of microscopic particles included in an inner peripheral part of the liquid film of water according to a reference example.
Figure 12:
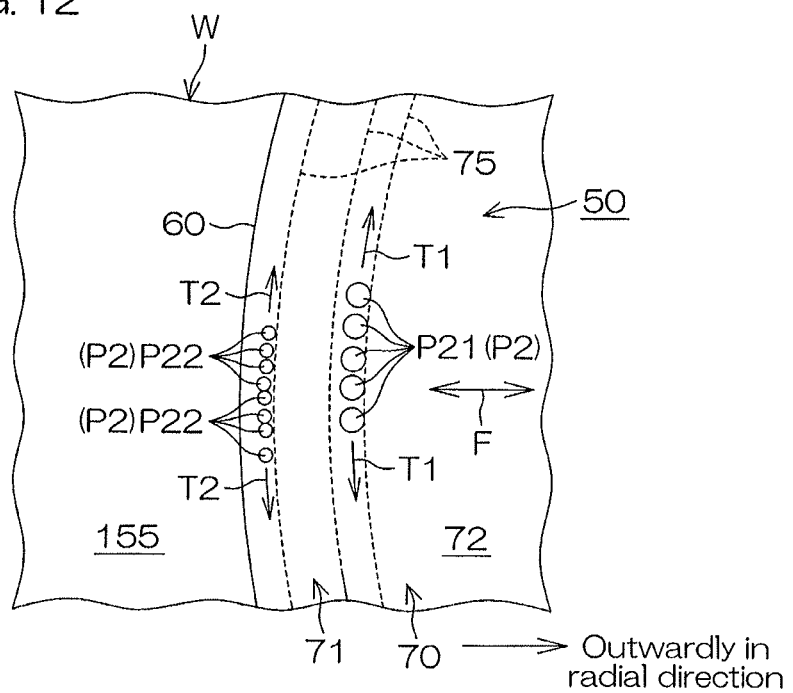
FIG. 12 is a schematic plan view showing the movement of microscopic particles included in the inner peripheral part of the liquid film of water according to a reference example.

FIG. 11 is a schematic cross-sectional view showing the movement of microscopic particles P2 included in the inner peripheral part of the liquid film of water according to a reference example. FIG. 12 is a schematic plan view showing the movement of microscopic particles P2 included in the inner peripheral part of the liquid film of water according to a reference example.

As shown in FIG. 11, the inner peripheral part 70 of the liquid film of water includes a boundary layer 73 formed near its boundary with the upper surface of the substrate W and a flowing layer 74 formed on the side opposite to the upper surface of the substrate W with respect to the boundary layer 73. If microscopic particles P2 are included in the inner peripheral part 70 of the liquid film of water, particles P are strongly influenced by a flow irrespective of the largeness or smallness of a particle diameter in the flowing layer 74. Therefore, the particles P existing in the flowing layer 74 are movable in a direction along the flow.

On the other hand, in the boundary layer 73, macroscopic particles P1 are influenced by a flow, whereas microscopic particles P2 are hardly influenced by the flow. In other words, macroscopic particles P1 existing in the boundary layer 73 are movable in a direction along the flow in the boundary layer 73, whereas microscopic particles P2 do not move in a direction F (see FIG. 12) along the flow in the boundary layer 73. However, the microscopic particles P2 do not adhere to the upper surface of the substrate W, and are disposed at the upper surface of the substrate W with very small intervals therebetween.

In the near-interface region 71 shown in FIG. 10, the majority of the inner peripheral part 70 of the liquid film of water is the boundary layer 73 shown in FIG. 11. Also, in FIG. 10, the ratio of the flowing layer 74 (see FIG. 11) becomes larger in proportion to an approach toward the bulk 72 from the near-interface region 71. Therefore, the microscopic particles P2 existing in the near-interface region 71 do not move in the direction along the flow unless another great force acts.

As shown in FIG. 12, in the near-interface region 71, interference fringes 75 are seen with the naked eye because of a difference in thickness of the liquid film 50. The interference fringes 75 are contour lines.

The microscopic particles P2 do not move in the direction F (see FIG. 12) along the flow as described above, and yet are movable in tangential directions D1 and D2 of the interference fringes 75. The microscopic particles P2 are arranged so as to form lines along the tangential directions D1 and D2, respectively, of the interference fringes 75 in the near-interface region 71. In other words, the microscopic particles P2 are arranged along the line of the gas-liquid-solid interface 60. The microscopic particles P2 form lines each of which is determined according to the size of the particle P. The microscopic particles P21 each of which has a comparatively large diameter are disposed at more outward positions in the radial direction than the microscopic particles P22 each of which has a comparatively small diameter.

Figure 13A:
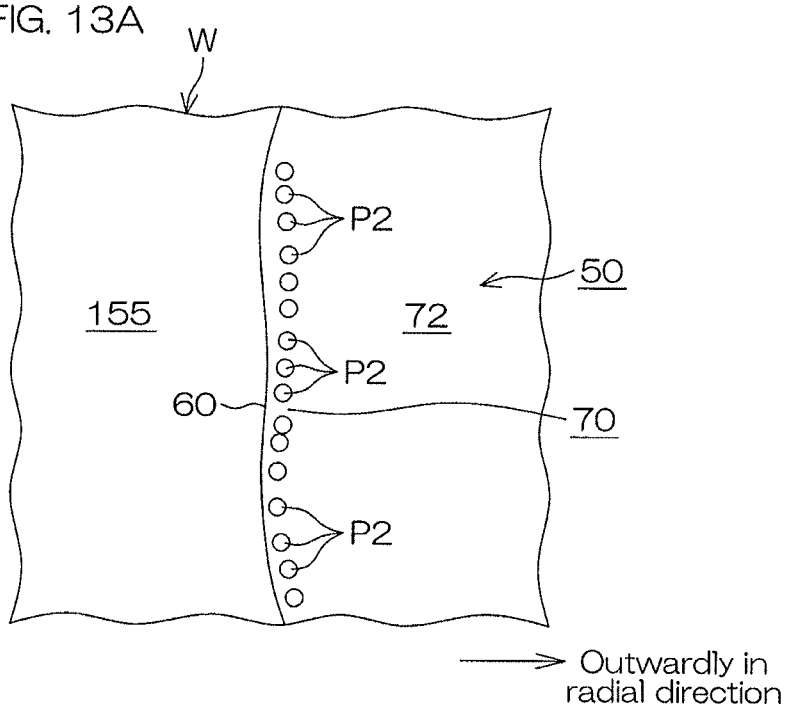
FIGS. 13A and 13B are plan views, each showing a state of the inner peripheral part of the liquid film of water during the expansion of a liquid film removal region according to a reference example.
Figure 13B:
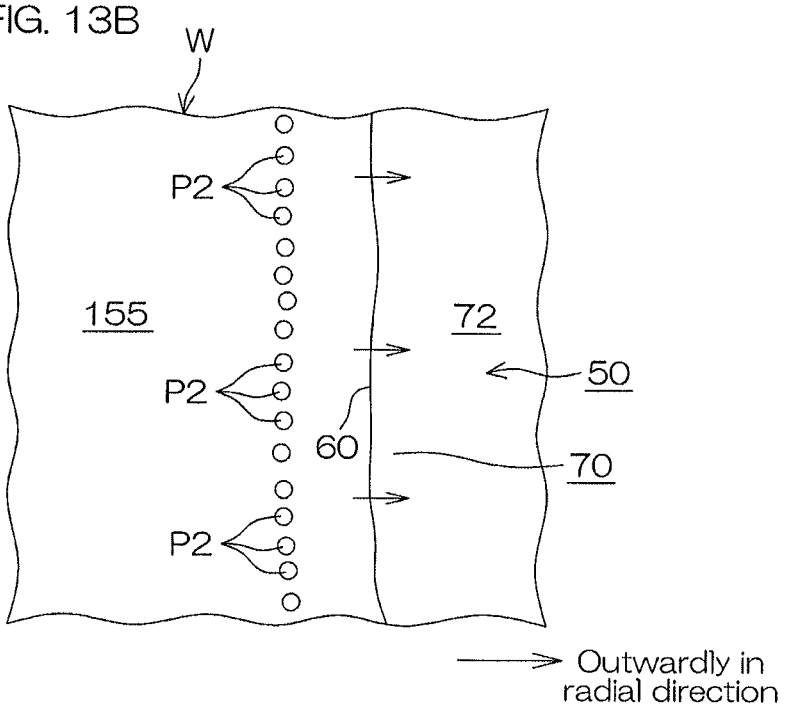

FIGS. 13A and 13B are plan views, each showing a state of the inner peripheral part 70 of the liquid film of water during the expansion of the liquid film removal region 155 according to a reference example.

In FIG. 13A, microscopic particles P2 are in a state of being included in the inner peripheral part 70 (more specifically, the second part 70B of FIG. 10) of the liquid film of water. The microscopic particles P2 are arranged along the line of the gas-liquid-solid interface 60.

As shown in FIG. 13B, when the gas-liquid-solid interface 60 is moved outwardly in the radial direction of the substrate W (in the direction toward the bulk 72) with the expansion of the liquid film removal region 155, a force pressing inwardly in the radial direction acts on the microscopic particles P2 because the heat convection 76 (see FIG. 10) flowing from the bulk—72 side toward the gas-liquid-solid-interface—60 side is occurring in the near-interface region 71. With the expansion of the liquid film removal region 155, the gas-liquid-solid interface 60 is moved outwardly in the radial direction of the substrate W (in the direction toward the bulk 72). However, the microscopic particles P2 cannot be moved in the radial direction (direction along the flow), and therefore the microscopic particles P2 are not moved even if the gas-liquid-solid interface 60 is moved. Therefore, the microscopic particles P2 included in the near-interface region 71 are moved from the gas-liquid-solid interface 60 to the liquid film removal region 155, and are precipitated on the liquid film removal region 155. Accordingly, the microscopic particles P2 remain on the upper surface of the substrate W from which the liquid film 50 of water has been removed.

Figure 14:
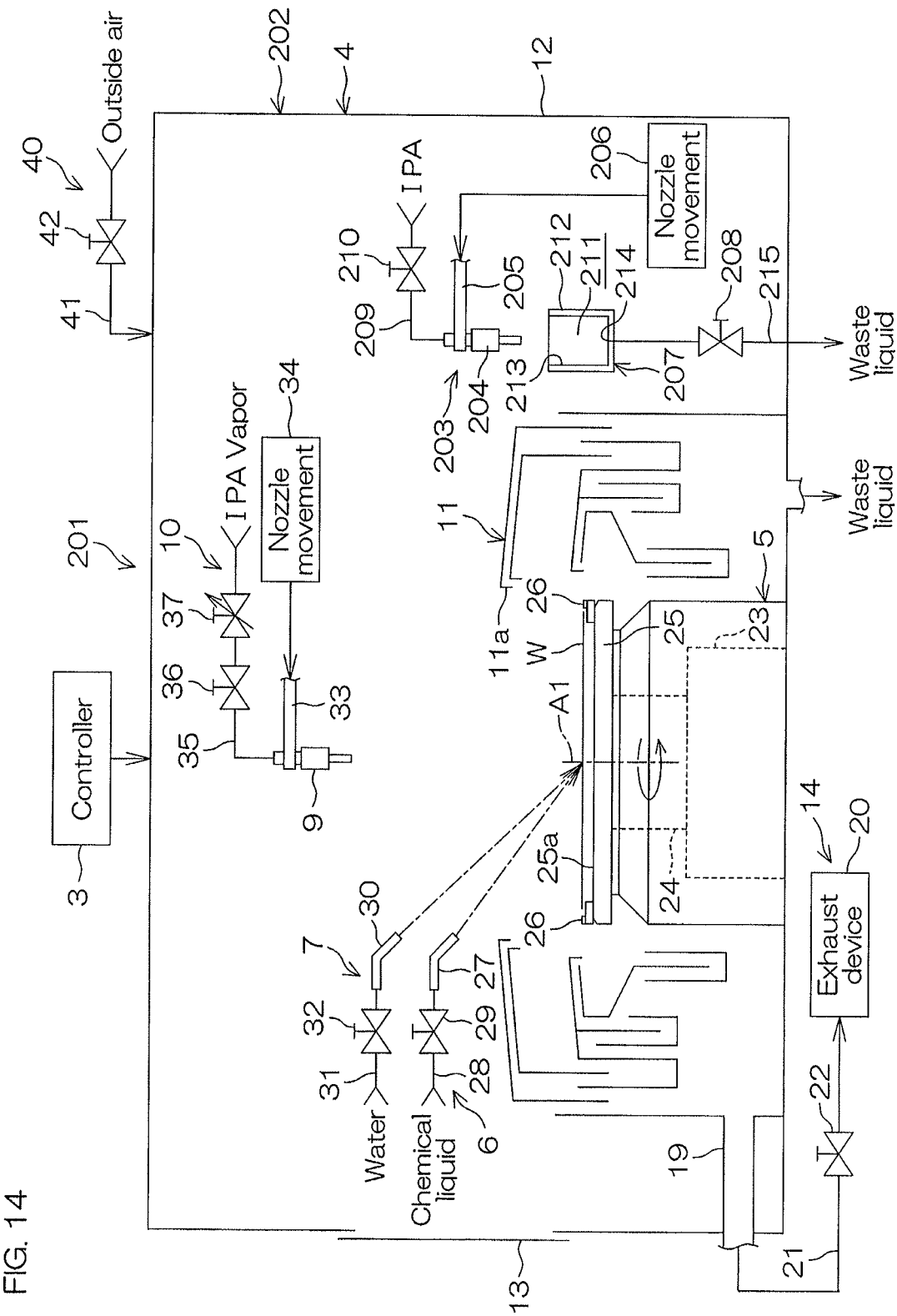
FIG. 14 is an illustrative cross-sectional view for describing an arrangement example of a processing unit of a substrate processing apparatus according to a second preferred embodiment of the present invention.

FIG. 14 is an illustrative cross-sectional view for describing an arrangement example of a processing unit 202 of a substrate processing apparatus 201 according to a second preferred embodiment of the present invention.

In the second preferred embodiment, the same reference sign as in FIG. 1 to FIG. 9 is given to a component corresponding to each component shown in the first preferred embodiment mentioned above, and a description of the component is omitted.

The processing unit 202 differs from the processing unit 2 according to the first preferred embodiment in the fact that the organic-solvent-vapor supply unit 8 is excluded and in the fact that an organic-solvent-liquid discharge unit 203 that discharges an IPA liquid that is an example of an organic solvent liquid serving as a low surface tension liquid is provided.

The organic-solvent-liquid discharge unit 203 includes an organic-solvent-liquid nozzle 204 that discharges an IPA liquid, a second nozzle arm 205 having its forward end to which the organic-solvent-liquid nozzle 204 is attached, a second nozzle-moving unit 206 that moves the organic-solvent-liquid nozzle 204 by moving the second nozzle arm 205, a standby pot 207 (storage container) disposed around the processing cup 11 in a plan view, and a drainage valve 208 that executes switching between the discharge and the discharge stoppage of liquids contained in the standby pot 207.

An organic solvent pipe 209 that supplies an organic solvent (IPA) liquid having a normal temperature sent from an organic-solvent supply source to the organic-solvent-liquid nozzle 204 is connected to the organic-solvent-liquid nozzle 204. An organic solvent valve 210 that executes switching between the supply and the supply stoppage of an organic solvent liquid from the organic solvent pipe 209 to the organic-solvent-liquid nozzle 204 is interposed in the organic solvent pipe 209.

The standby pot 207 is a pot that receives an organic solvent liquid discharged from the organic-solvent-liquid nozzle 204 disposed at a retreat position that is set to retreat from the upper surface of the substrate W. The standby pot 207 includes a box-shaped housing 212 that partitions the internal space 211. The housing 212 has an opening 213 formed in an upper surface of the housing 212 and a discharge port 214 formed in a bottom wall 212a of the housing 212. One end of a drainage pipe 215 is connected to the discharge port 214 of the standby pot 207. The other end of the drainage pipe 215 is connected to a piece of liquid waste disposal equipment placed outside the apparatus. The drainage valve 208 is interposed in the drainage pipe 215. The controller 3 controls the open-close operation of the drainage valve 208.

In a state in which the organic-solvent-liquid nozzle 204 is placed at the retreat position, the controller 3 opens the organic solvent valve 210 and discharges the organic solvent liquid from the organic-solvent-liquid nozzle 204 while closing the drainage valve 208. Whereby, it is possible to store an organic solvent liquid in the internal space 211 of the standby pot 207.

Substrate processing executed in the substrate processing apparatus 201 differs from that in the substrate processing apparatus 1 according to the first preferred embodiment in the fact that the whole area around the upper surface of the substrate W is kept in an organic-solvent-vapor atmosphere according to not a technique in which an organic solvent vapor is supplied from the organic-solvent-vapor supply unit 8 to the internal space SP but a technique in which an organic solvent liquid is stored in an internal space 211 of the standby pot 207 and in which the internal space SP is filled with an organic solvent vapor generated by the evaporation of the organic solvent liquid.

More specifically, the controller 3 closes the clean-air valve 42 in synchronization with the start of the puddle rinse step T1. Consequently, the internal space SP is brought into a state of being closed from the outside, and the processing chamber 4 functions as a closed chamber that has been closed from the outside.

The controller 3 further opens the organic solvent valve 210 while closing the drainage valve 208 in synchronization with the start of the puddle rinse step T1. Consequently, the organic solvent liquid is stored in the internal space 211 of the standby pot 207. When the organic solvent liquid stored in the internal space 211 reaches a predetermined amount, the organic solvent liquid stops being discarded from the organic-solvent-liquid nozzle 204. The organic solvent stored in the internal space 211 is lower in boiling point than water, and therefore the amount of evaporation is large. An organic solvent vapor generated by the evaporation of the organic solvent liquid is supplied to the internal space SP, and the whole area of the internal space SP is filled therewith.

After the dry region expanding step T3 is ended, the controller 3 further opens the drainage valve 208. Consequently, the drainage pipe 215 is opened, and the organic solvent liquid stored in the internal space 211 is sent to the liquid waste disposal equipment placed outside the apparatus through the drainage pipe 215. The controller 3 further opens the clean-air valve 42 and the exhaust valve 22, and replaces and changes the atmosphere of the internal space SP from the organic solvent vapor to clean air.

Figure 15A:
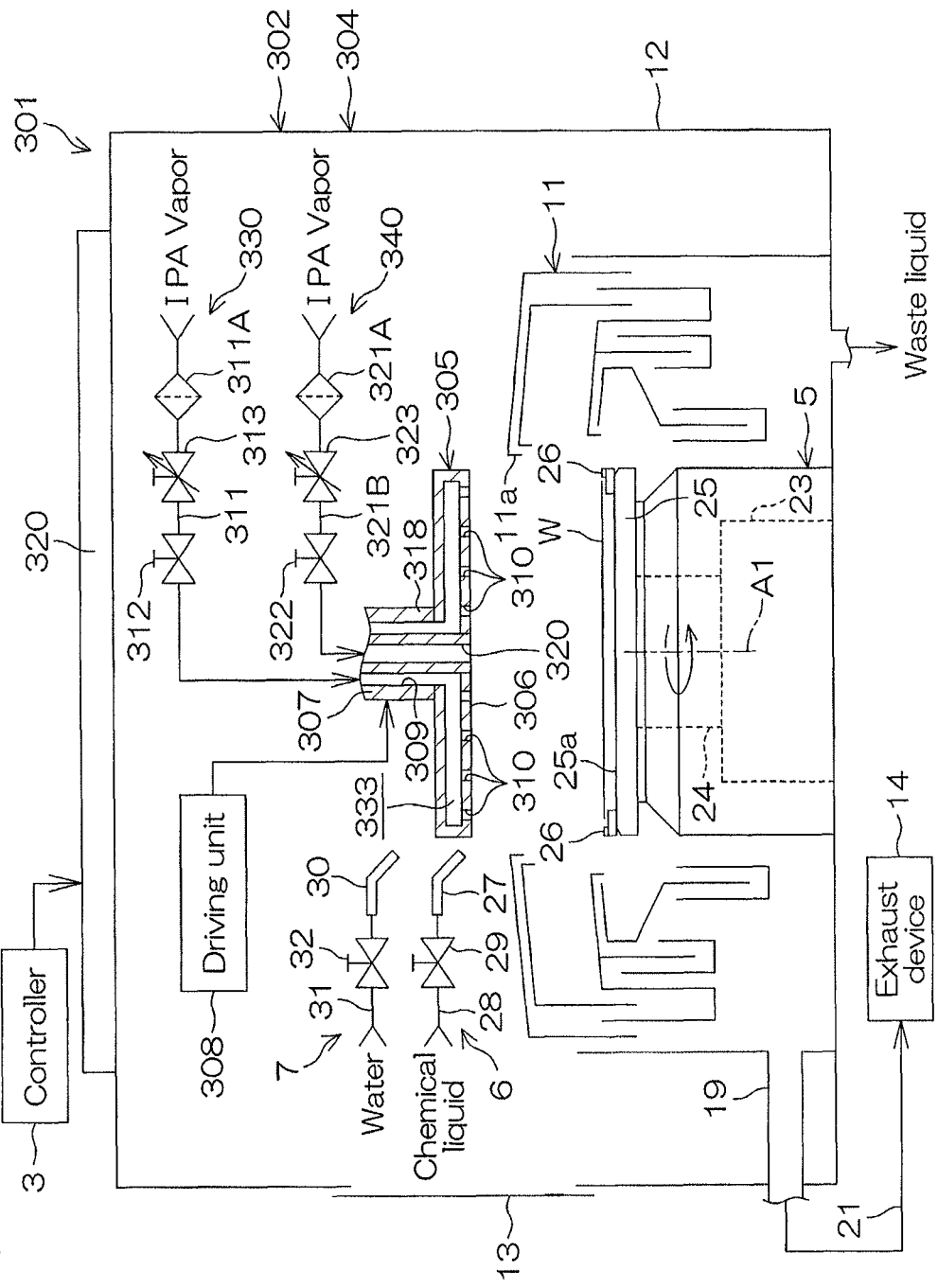
FIG. 15A is an illustrative cross-sectional view for describing an arrangement example of a processing unit of a substrate processing apparatus according to a third preferred embodiment of the present invention.

FIG. 15A is an illustrative cross-sectional view for describing an arrangement example of a processing unit 302 of a substrate processing apparatus 301 according to a third preferred embodiment of the present invention. FIG. 15B is a bottom view of a facing member 305.

In the third preferred embodiment, the same reference sign as in FIG. 1 to FIG. 9 is given to a component corresponding to each component shown in the first preferred embodiment mentioned above, and a description of the component is omitted.

The processing unit 302 differs from the processing unit 2 according to the first preferred embodiment in the fact that a processing chamber 304 that is not a closed chamber is provided as a chamber. In more detail, the organic-solvent-vapor supply unit 8 and the blowing unit 40 are not joined to the processing chamber 304, and, instead, the processing chamber 304 includes an FFU (fan filter unit) 320 serving as a blowing unit that sends clean air into the partition wall 12. Also, unlike the first preferred embodiment, the exhaust pipe 21 of the exhaust unit 14 is not provided so as to be openable and closable.

The processing unit 302 further differs from the processing unit 2 according to the first preferred embodiment in the fact that a facing member 305 that faces the upper surface of the substrate W held by the spin chuck 5 is provided in the processing chamber 304. A third organic-solvent-vapor supply unit (first gas supply unit) 330 that supplies an IPA vapor that is an example of an organic solvent vapor serving as a low surface tension liquid to the first gas discharge port 310 and a fourth organic-solvent-vapor supply unit (second gas supply unit) 340 that supplies an IPA vapor to the second gas discharge port 320 are connected to the facing member 305.

The FFU 320 is disposed above the partition wall 12, and is attached to the ceiling of the partition wall 12. The FFU 320 sends clean air into the processing chamber 304 from the ceiling of the partition wall 12. A downward flow is formed in the processing chamber 304 by means of the FFU 320 and the exhaust unit 14.

The facing member 305 has a disk shape. The diameter of the facing member 305 is equal to or larger than the diameter of the substrate W. A circular facing surface 306 that is a horizontal flat surface and that faces the upper surface of the substrate W held by the spin chuck 5 is formed on a lower surface of the facing member 305. The facing surface 306 faces the whole area of the upper surface of the substrate W. As shown in FIG. 15B, the facing surface 306 has a single second gas discharge port 320 formed at its central part (part facing the rotational center of the upper surface of the substrate W). The facing surface 306 has many (a plurality of) first gas discharge ports 310 that are formed in the whole area (region excluding the formation position of the second gas discharge port 310) excluding the central part and that are dispersedly arranged in equal density.

The facing member 305 is made of a resin material, such as PFA (perfluoroalkoxyethylene), PTFE (polytetrafluoroethylene), or PVC (polyvinyl chloride). The facing member 305 is hollow. More specifically, a disk-shaped first gas supply path 333 is formed inside the facing member 305. The first gas supply path 333 communicates with all of the first gas discharge ports 310.

A holder 307 is fixed to the upper surface of the facing member 305. The holder 307 sets a vertical axis passing through the center of the facing member 305 (i.e., vertical axis that coincides with the rotational axis A1 of the spin chuck 5) as a central axis. An lifting unit 308 is joined to the holder 307. The facing member 305 is supported by the holder 307 such that the central axis of the facing member 305 is placed on the rotational axis A1 of the spin chuck 5 and such that the facing member 305 assumes a horizontal attitude. The holder 307 is hollowly formed, and an inner cylinder 318 is inserted into the inside thereof in a state of extending in the vertical direction. A lower end of the inner cylinder 318 is opened in the central part of the facing surface 306, and forms a second gas discharge port 320. A cylindrical second gas supply path 309 is formed between an inner periphery of the holder 307 and an outer periphery of the inner cylinder 318. The second gas supply path 309 communicates with the first gas supply path 333.

The third organic-solvent-vapor supply unit 330 includes a third organic-solvent-vapor pipe 311 connected to the second gas supply path 309. An organic solvent vapor is supplied from the organic-solvent-vapor supply source to the third organic-solvent-vapor pipe 311. An organic solvent vapor is supplied from the organic-solvent-vapor supply source to the third organic-solvent-vapor pipe 311. A third organic-solvent-vapor valve 312 that opens and closes the third organic-solvent-vapor pipe 311, a third flow regulating valve 313 that regulates the flow rate of an organic solvent vapor discharged from each of the first gas discharge ports 310 while adjusting the opening degree of the third organic-solvent-vapor pipe 311, and a third filter 311A that captures dust and dirt included in an organic solvent vapor flowing through the third organic-solvent-vapor pipe 311 are interposed in the third organic-solvent-vapor pipe 311. When the third organic-solvent-vapor valve 312 is opened, an organic solvent vapor (clean organic solvent vapor from which dust and dirt have been removed) that has been supplied to the second gas supply path 309 from the third organic-solvent-vapor pipe 311 is discharged downwardly from each of the first gas discharge ports 310.

The fourth organic-solvent-vapor supply unit 340 includes a fourth organic-solvent-vapor pipe 321B connected to the inside of the inner cylinder 318. An organic solvent vapor is supplied from the organic-solvent-vapor supply source to the fourth organic-solvent-vapor pipe 321B. An organic solvent vapor is supplied from the organic-solvent-vapor supply source to the fourth organic-solvent-vapor pipe 321B. A fourth organic-solvent-vapor valve 322 that opens and closes the fourth organic-solvent-vapor pipe 321B, a fourth flow regulating valve 323 that regulates the flow rate of an organic solvent vapor discharged from the second gas discharge port 320 while adjusting the opening degree of the fourth organic-solvent-vapor pipe 321B, and a fourth filter 321A that captures dust and dirt included in an organic solvent vapor flowing through the fourth organic-solvent-vapor pipe 321B are interposed in the fourth organic-solvent-vapor pipe 321B. When the fourth organic-solvent-vapor valve 322 is opened, an organic solvent vapor (clean organic solvent vapor from which dust and dirt have been removed) that has been supplied to the inner cylinder 318 from the fourth organic-solvent-vapor pipe 321B is discharged downwardly from the second gas discharge port 320.

The lifting unit 308 is connected to the controller 3 (see FIG. 2 and the like). The controller 3 controls the lifting unit 308, and allows the facing surface 306 of the facing member 305 to move down and up between a nearby position (position shown in FIG. 17) that approaches the upper surface of the substrate W held by the spin chuck 5 and a retreat position (position shown in FIG. 15) that retreats largely upwardly from the spin chuck 5.

The controller 3 is formed of, for example, a microcomputer. The controller 3 has an arithmetic unit, such as CPU, a storage unit, such as a read-only memory device or a hard disk drive, and an input-output unit. A program that is executed by the arithmetic unit is stored in the storage unit.

The controller 3 controls the operation of the lifting unit 308 in accordance with a predetermined program. The controller 3 further controls the open-close operations and the like of the third organic-solvent-vapor valve 312, the third flow regulating valve 313, the fourth organic-solvent-vapor valve 322, the fourth flow regulating valve 323, etc.

In the substrate processing apparatus 301 according to the third preferred embodiment, substrate processing (S1 to S5 of FIG. 4) is executed that is equivalent to the substrate processing executed in the substrate processing apparatus 1 according to the first preferred embodiment. A description will be hereinafter given while laying stress on a point in which substrate processing executed in the substrate processing apparatus 301 according to the third preferred embodiment differs from that of the substrate processing apparatus 1 according to the first preferred embodiment.

In the substrate processing, an unprocessed substrate W is carried into the processing unit 302, and is carried into the processing chamber 304. When the substrate W is carried thereinto, the facing member 305 is placed at the retreat position. After the substrate W is carried thereinto, the controller 3 successively executes the chemical liquid step (S2 of FIG. 4) and the rinse step (S3 of FIG. 4).

Figure 16:
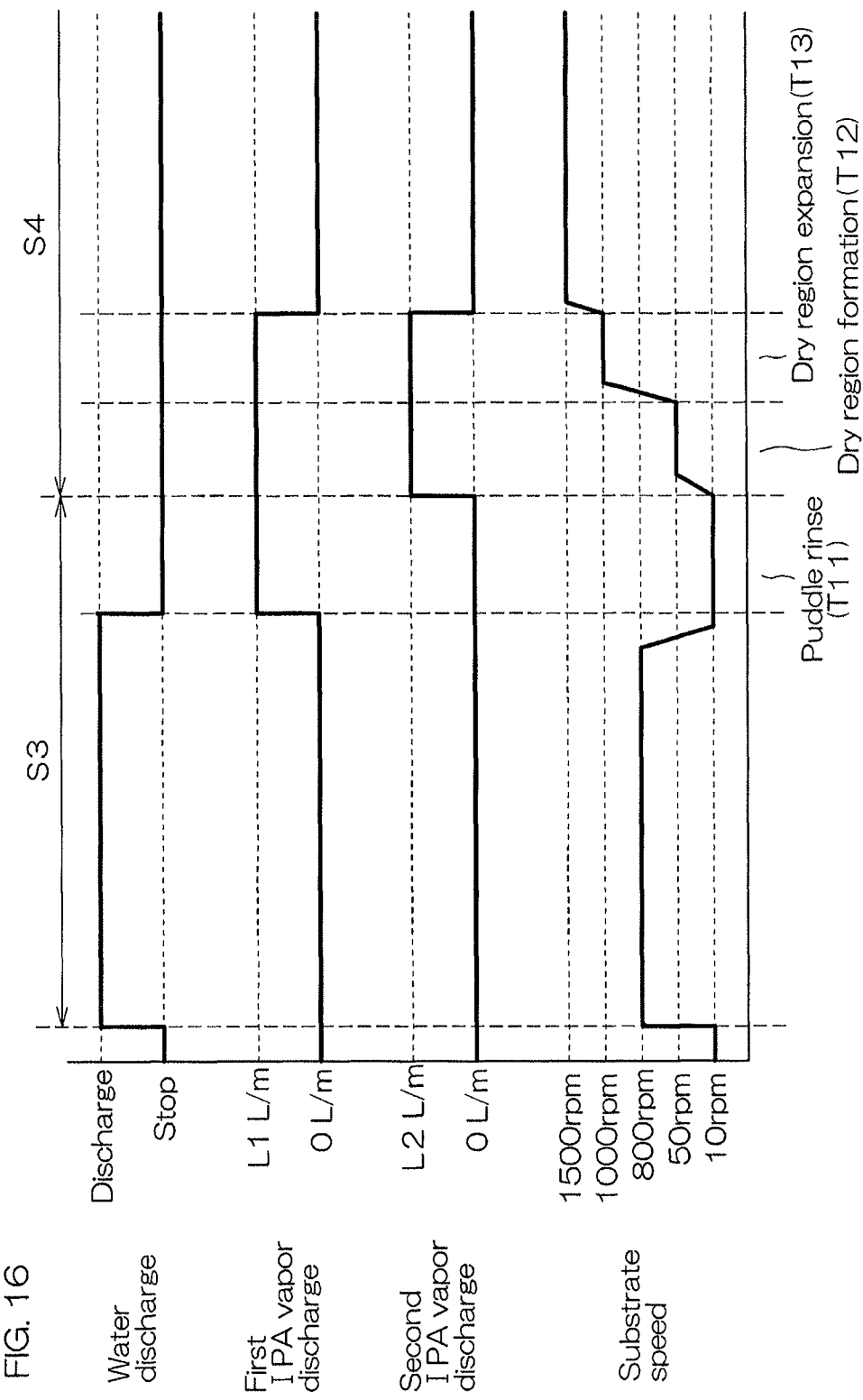
FIG. 16 is a time chart to describe a rinse step (S3) and a spin dry step (S4) that are executed in the substrate processing apparatus according to the third preferred embodiment of the present invention.

FIG. 16 is a time chart to describe the rinse step (S3) and the spin dry step (S4) that are executed in the substrate processing apparatus 301.

In the rinse step, when a predetermined period of time elapses from the start of the supply of water, the puddle rinse step T11 is executed. The puddle rinse step T11 is a step equivalent to the puddle rinse step T1 (see FIG. 5).

Figure 17:
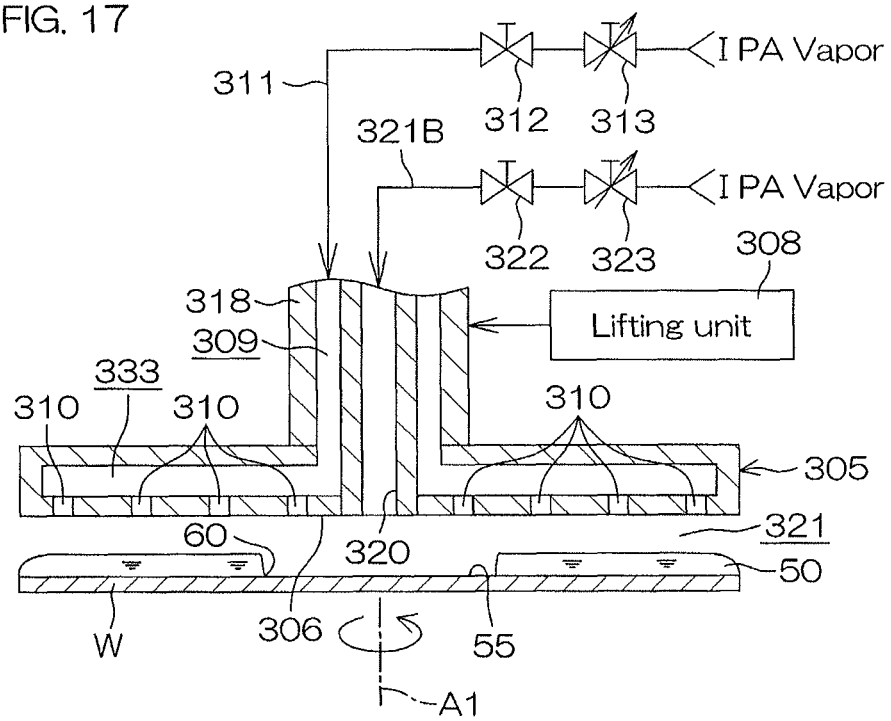
FIG. 17 is a cross-sectional view showing a state in which the facing member is disposed at a nearby position.

Prior to the start of the puddle rinse step T11, the controller 3 controls the lifting unit 308, and lowers the facing member 305 to the nearby position as shown in FIG. 17. A first nearby position of the facing member 305 is at a height at which the facing surface 306 does not come into contact with the upper surface of the liquid film 50 of water in the puddle rinse step T11, and, when the facing member 305 is placed at the nearby position, the interval between the facing surface 306 and the upper surface of the substrate W is about 5 mm, and a narrow space (space above the substrate W) 321 that is blocked from its surroundings (the outside) is formed between the facing surface 306 and the upper surface of the substrate W (blocking step).

The controller 3 further opens the third organic-solvent-vapor valve 312 in synchronization with the start of the puddle rinse step T11, and discharges an organic solvent vapor from the first gas discharge port 310 (first IPA vapor discharge). The total discharge flow amount of the organic solvent vapor from the first gas discharge port 310 is L1 (L/min) that is low in flow amount. The gas discharge ports 310 are equal to each other in the discharge flow amount of the organic solvent vapor discharged therefrom. The organic solvent vapor discharged from each of the first gas discharge ports 310 is supplied to the narrow space 321. The narrow space 321 is blocked from the surroundings, and therefore the narrow space 321 is filled with the organic solvent vapor supplied thereto. As a result, it is possible to fill the surroundings of the liquid film 50 of water on the substrate W with an organic-solvent-vapor atmosphere (vapor atmosphere filling step).

The narrow space 321 blocked from the surroundings is hardly influenced by a disturbance of a surrounding atmosphere. Therefore, after this, the surroundings of the entire upper surface of the substrate W are kept in an atmosphere containing a highly-concentrated organic solvent vapor (hereinafter, referred to as an "organic-solvent-vapor atmosphere"). In other words, the whole area around the upper surface of the substrate W on which the liquid film 50 of water being in a puddle state is formed is kept in an organic-solvent-vapor atmosphere.

Also, the first gas discharge port 310 is dispersedly arranged in the form of a plurality of gas discharge ports, and therefore it is possible to evenly supply an organic solvent vapor sent from each of the first gas discharge ports 310 to the liquid film 50 of water on the substrate W. Also, the first gas discharge ports 310 are equal to each other in the discharge flow amount of the organic solvent vapor discharged from each of the first gas discharge ports 310 that is small in flow amount, and therefore the first gas discharge ports 310 are equal to each other in the discharge pressure of the organic solvent vapor discharged from each of the first gas discharge ports 310. This makes it possible to reliably prevent the liquid film 50 of water from being pressed and deformed by the discharge pressure of the organic solvent vapor. In other words, the first gas discharge port 310 dispersedly arranged in the form of a plurality of gas discharge ports is a mode that does not have local directivity with respect to the upper surface of the substrate W.

After the liquid film 50 of water being in a puddle state is formed, the controller 3 closes the water valve 32, and stops the discharge of water from the water nozzle 30. Consequently, the puddle rinse step T11 is ended.

Thereafter, the controller 3 executes the spin dry step (S4 of FIG. 4). First, the controller 3 executes the dry region forming step T12.

In the third preferred embodiment, the controller 3 opens the fourth organic-solvent-vapor valve 322, so that an organic solvent vapor is discharged from the second gas discharge port 320. At this time, the controller 3 controls the fourth flow regulating valve 323 so that the discharge flow amount from the second gas discharge port 310 reaches a large flow rate. In more detail, the controller 3 supplies an organic solvent vapor to the second gas discharge port 320 at a supply flow rate L2 (L/min) (L2>>L1) while maintaining the supply total flow rate of the organic solvent vapor of the gas discharge port 310 at L1. Consequently, a large flow of organic solvent is discharged downwardly from the second gas discharge port 320. The controller 3 further controls the spin motor 23, and accelerates the substrate W to a predetermined speed (for example, about 50 rpm).

An organic solvent vapor is sprayed onto the central part of the liquid film 50 of water of the upper surface of the substrate W, and, as a result, water existing at the central part of the liquid film 50 of water is blown off and is removed from the central part of the upper surface of the substrate W by means of a spray pressure (gas pressure). Furthermore, a comparatively strong centrifugal force acts on the liquid film 50 of water on the substrate W by the fact that the rotation speed of the substrate W has reached a predetermined speed (for example, about 50 rpm). These make it possible to form the circular dry region 55 at the central part of the upper surface of the substrate W.

In the dry region forming step T12, strong discharge pressure of the organic solvent vapor is not applied onto parts other than the central part (dry region—55 forming region) of the liquid film 50 of water, and therefore the liquid film 50 of water is not deformed. Therefore, it is possible to keep the liquid film 50 (bulk 72) of water as thick as possible. This makes it possible to strengthen Marangoni convection 65 that occurs in the inner peripheral part 70 of the liquid film of water.

The dry region expanding step T13 is executed subsequent to the dry region forming step T12.

In the dry region expanding step T13, the controller raises the rotation speed of the substrate W to a predetermined dry speed (for example, 1000 rpm) while controlling the spin motor 23. In response to a rise in the rotation speed of the substrate W, the dry region 55 is expanded (see FIGS. 6D and 6E). As a result of the expansion of the dry region 55, the gas-liquid-solid interface 60 between the dry region 55 and the upper surface of the substrate W of the liquid film 50 of water is moved outwardly in the radial direction of the substrate W. Thereafter, the dry region 55 is expanded over the whole area of the substrate W (see FIG. 6F), and, as a result, the liquid film 50 of water is all discharged outwardly from the substrate W.

In the dry region expanding step T13, strong discharge pressure of the organic solvent vapor is not applied onto parts other than the dry region—55 forming region of the liquid film 50 of water, and therefore the liquid film 50 of water is not deformed. Therefore, it is possible to keep the liquid film 50 (bulk 72) of water as thick as possible. This makes it possible to strengthen Marangoni convection 65 that occurs in the inner peripheral part 70 of the liquid film of water.

The organic solvent vapor continues to be discharged from the first gas discharge port 310 over the entire period of the dry region expanding step T13. Therefore, the whole area of the upper surface of the substrate W is kept in the organic solvent vapor over the entire period of the dry region expanding step T13. Therefore, it is possible to keep the atmosphere around the inner peripheral part 70 of the liquid film of water as an organic-solvent-vapor atmosphere irrespective of an expansion situation of the dry region 55.

After the dry region 55 is expanded to the whole area of the upper surface of the substrate W, the controller 3 ends the dry region expanding step T13. According to the end of the dry region expanding step T13, the controller 3 closes the third organic-solvent-vapor valve 312 and the fourth organic-solvent-vapor valve 322, and stops the discharge of the organic solvent vapor from the first gas discharge port 310 and from the second gas discharge port 320. The controller 3 further controls the lifting unit 308, and raises the facing member 305 from the nearby position to an away position. Consequently, the atmosphere of the whole area of the upper surface of the substrate W is replaced and changed from the organic solvent vapor to clean air.

Thereafter, the controller 3 allows the substrate W to be continuously rotated without changing a high speed of about 1000 rpm. This makes it possible to excellently dry the upper surface of the substrate W.

When a predetermined period of time elapses from the start of the spin dry step (S4 of FIG. 4), the controller 3 stops the rotation of the spin chuck 5 while controlling the spin motor 23. Thereafter, an already-processed substrate W is carried outwardly from the processing unit 302 by means of the transfer robot CR (S5 of FIG. 4).

Although the three preferred embodiments of the present invention have been described as above, the present invention can be embodied in still other modes.

Figure 18:
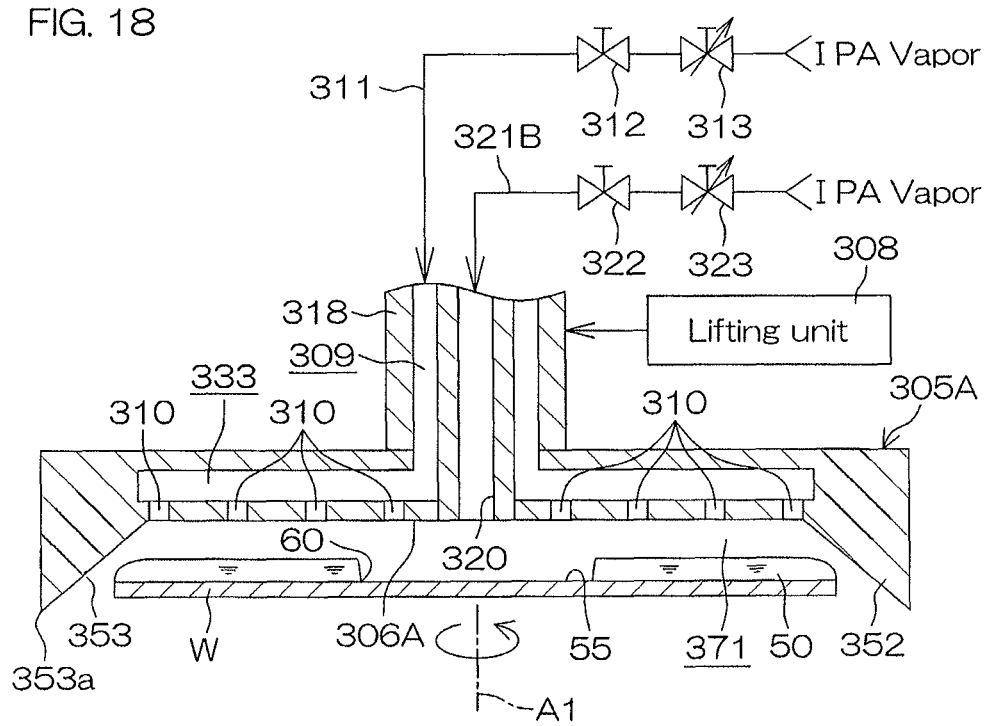
FIG. 18 is a cross-sectional view showing a modification of the substrate processing apparatus according to the third preferred embodiment of the present invention.

FIG. 18 is a cross-sectional view showing a modification of the substrate processing apparatus 301 according to the third preferred embodiment of the present invention.

In FIG. 18, the same reference sign as in FIG. 15 to FIG. 17 is given to a component equivalent to each component shown in the third preferred embodiment, and a description of the component is omitted. In the modification of FIG. 18, a facing member 305A is provided instead of the facing member 305 according to the third preferred embodiment.

The facing member 305A has a disk shape. The diameter of the facing member 305A may be equal to the diameter of the substrate W, or may be larger than the diameter of the substrate W as shown in FIG. 18. A facing surface 306A that faces the upper surface of the substrate W held by the spin chuck 5 is formed on a lower surface of the facing member 305A. A central part of the facing surface 306A is formed so as to be horizontally flat. An annular projection 352 (facing peripheral edge) is formed on a peripheral edge of the facing surface 306A. A tapered surface 353 that descends in proportion to the outward progress in the radial direction is formed on a lower surface of the annular projection 352. If the diameter of the facing member 305A is larger than the diameter of the substrate W as shown in FIG. 18, the peripheral edge of the facing member 305A protrudes more outwardly than the peripheral edge of the substrate W in a plan view.

In a state in which the facing member 305A is placed at the nearby position, an outer peripheral edge 353a of the tapered surface 353 is placed at a lower position than the upper surface of the substrate W with respect to the up-down direction as shown in FIG. 18. Therefore, a narrow space (space above the substrate W) 371 partitioned by the facing surface 306A and by the upper surface of the substrate W forms a closed space that is substantially closed from its surroundings (the outside), and is substantially completely blocked from the surroundings (blocking step). The interval between the peripheral edge of the upper surface of the substrate W and the annular projection 352 (i.e., tapered surface 353) is provided to be extremely smaller than the interval between the central part of the facing surface 306A and the central part of the upper surface of the substrate W.

In this case, the narrow space 371 partitioned by the facing surface 306A and by the upper surface of the substrate W is substantially closed from its outer space, and therefore an organic solvent vapor supplied to the narrow space 371 is hardly discharged from the narrow space 371. Also, the narrow space 371 is not influenced by a disturbance of a surrounding atmosphere. These make it possible to reliably keep the whole area of the upper surface of the substrate W in an organic-solvent-vapor atmosphere.

Although an arrangement in which each of the first gas discharge ports 310 discharges an organic solvent vapor vertically downwardly has been described as an example in the third preferred embodiment and in the mode of FIG. 18 that is its modification, it is also possible to employ an arrangement in which each of the first gas discharge ports 310 discharges an organic solvent vapor in a diagonal direction that takes an outer peripheral direction in proportion to downward progress.

Also, in the third preferred embodiment and in the mode of FIG. 18 that is its modification, the first gas discharge port 310 may be disposed at the central part of the facing surface 306, 306A. In other words, the second gas discharge port 320 may assume the function of the first gas discharge port 310. In this case, preferably, the discharge pressure of an organic solvent vapor discharged from the first gas discharge port 310 disposed at the central part of the facing surface 306, 306A is weaker than the discharge pressure of an organic solvent vapor discharged from each of the other first gas discharge ports 310.

Also, the first gas discharge port 310 can also be disposed at a position except the position of the facing surface 306, 306A, and the first gas discharge port 310 may be disposed, for example, around the spin base 25 and at a lower position than the substrate W supported by the spin base 25.

Also, although the organic-solvent-vapor supply unit 8 and the nozzle-gas supply unit 10 are units each of which supplies an organic solvent vapor as described in the first and second preferred embodiments, the supply units 8 and 10 may be arranged to supply a mixed gas consisting of an organic solvent vapor and an inert gas (for example, nitrogen gas). Likewise, although an organic solvent vapor is supplied to the gas discharge ports 310 and 320 as described in the third preferred embodiment, a mixed gas consisting of an organic solvent vapor and an inert gas (for example, nitrogen gas) may be supplied thereto.

Also, although a liquid film 50 of water being in a puddle state is formed on the upper surface of the substrate W by keeping the rotation speed of the substrate W at a puddle speed, and a dry region 55 is provided in the liquid film 50 of water being in a puddle state as described in each of the aforementioned preferred embodiments, the liquid film 50 of water is not necessarily required to be in a puddle state, and the dry region 55 may be provided in a liquid film of water being rotated at a higher speed than the puddle speed.

Also, a technique in which the dry region 55 is expanded by a rise in the rotation speed of a substrate in the dry region expanding steps T3 and T13 has been described as an example in each of the aforementioned preferred embodiments. However, the dry region 55 may be expanded only by spraying an organic solvent vapor onto the substrate W without increasing the rotation speed of the substrate W.

Also, although, for example, IPA that is an example of an organic solvent is used as a low surface tension liquid that has lower surface tension than water as described in each of the aforementioned preferred embodiments, an organic solvent, such as methanol, ethanol, acetone, or HFE (hydrofluoroether), can be employed as the low surface tension liquid, besides IPA.

Also, although, for example, a processing liquid that forms a liquid film (liquid film 50 of water) of the processing liquid is water as described in each of the aforementioned preferred embodiments, the processing liquid forming a liquid film may be IPA (liquid). In this case, HFE can be employed as a vapor of a low surface tension liquid.

Also, although the substrate processing apparatuses 1, 201, and 301 are apparatuses for processing a disk-shaped substrate W as described in each of the aforementioned preferred embodiments, the substrate processing apparatuses 1, 201, and 301 may be apparatuses for processing a polygonal substrate, such as a glass substrate for liquid crystal display devices.

Although the preferred embodiments of the present invention have been described more specifically, these preferred embodiments are merely concrete examples used to clarify the technical contents of the present invention, and the present invention should not be understood by being limited to these concrete examples, and the scope of the present invention is limited solely by the appended claims.

The present application corresponds to Japanese Patent Application No. 2015-161325 filed in the Japan Patent Office on Aug. 18, 2015, and the entire disclosure of the application is incorporated herein by reference.

REFERENCE SIGNS LIST

1 Substrate processing apparatus
4 Processing chamber (closed chamber)
5 Spin chuck (substrate holding unit)
7 Water supply unit (processing liquid supply unit)
8 First organic-solvent-vapor supply unit (internal-gas supply unit, first gas supply unit)
9 Gas discharge nozzle
10 Second organic-solvent-vapor supply unit (second gas supply unit)
201 Substrate processing apparatus
203 Organic-solvent-liquid discharge unit (low surface tension liquid supply unit, first gas supply unit)
204 Organic-solvent-liquid nozzle (nozzle, first gas supply unit)
207 Standby pot (storage container, first gas supply unit)
301 Substrate processing apparatus
304 Processing chamber
330 Third organic-solvent-vapor supply unit (second gas supply unit)
352 Projection (facing peripheral edge)
SP Internal space
W Substrate

The invention claimed is:

1. A substrate processing method comprising:
a substrate holding step of horizontally holding a substrate;
a liquid film forming step of supplying a processing liquid to an upper surface of the substrate and forming a liquid film of the processing liquid with which the upper surface of the substrate is covered;
a puddle step of bringing the substrate into a stationary state or rotating the substrate at a puddle speed around a rotational axis, while continuously performing the liquid film forming step;
a vapor atmosphere filling step of supplying, from a gas discharge port to surroundings of the liquid film of the processing liquid, a vapor atmosphere containing a vapor of a low surface tension liquid that has a lower surface tension than the processing liquid, thereby filling the surroundings of a whole area of the liquid film with the vapor atmosphere;
a dry region forming step of spraying a gas containing the vapor of the low surface tension liquid from a second gas discharge port that is different from the gas discharge port onto a central portion of the liquid film of the processing liquid to push away the liquid film, thereby forming a dry region surrounded by the liquid film on the upper surface of the substrate in which the liquid film of the processing liquid is not present, while continuously performing the vapor atmosphere filling step; and
a dry region expanding step of expanding the dry region toward an outer periphery of the substrate until the liquid film is removed from the substrate by rotating the substrate around the rotational axis and while continuously performing the vapor atmosphere filling step, wherein the second gas discharge port is axially stationarity kept above a central part of the upper surface of the substrate and keeps spraying the gas containing the vapor of the low surface tension liquid onto the central part of the upper surface of the substrate for an entire duration of the dry region forming and expanding step.

2. The substrate processing method according to claim 1, further comprising a blocking step of bringing an upper space above the substrate into a blocked state of being blocked from outside, wherein the vapor atmosphere filling step is executed by supplying the gas to the upper space after the blocking step.

3. The substrate processing method according to claim 1, further comprising an open high speed rotation step of rotating the substrate at a predetermined high rotational speed around the rotational axis while opening an upper space above the substrate to the outside, after the dry region expanding step.

4. The substrate processing method according to claim 1, wherein the dry region expanding step includes a high speed rotation step of rotating the substrate around the rotational axis at a higher speed than in the liquid film forming step.

5. The substrate processing method according to claim 1, wherein the processing liquid includes water, and the low surface tension liquid includes an organic solvent.

* * * * *